(12) United States Patent
Hino et al.

(10) Patent No.: US 11,222,973 B2
(45) Date of Patent: Jan. 11, 2022

(54) SEMICONDUCTOR DEVICE

(71) Applicant: Mitsubishi Electric Corporation, Chiyoda-ku (JP)

(72) Inventors: Shiro Hino, Tokyo (JP); Koji Sadamatsu, Tokyo (JP); Hideyuki Hatta, Tokyo (JP); Yuichi Nagahisa, Tokyo (JP); Kohei Ebihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/082,212

(22) PCT Filed: Apr. 11, 2016

(86) PCT No.: PCT/JP2016/061706
§ 371 (c)(1),
(2) Date: Sep. 4, 2018

(87) PCT Pub. No.: WO2017/179102
PCT Pub. Date: Oct. 19, 2017

(65) Prior Publication Data
US 2019/0181259 A1    Jun. 13, 2019

(51) Int. Cl.
*H01L 29/78*    (2006.01)
*H01L 29/06*    (2006.01)
(Continued)

(52) U.S. Cl.
CPC .......... *H01L 29/7806* (2013.01); *H01L 27/04* (2013.01); *H01L 27/095* (2013.01);
(Continued)

(58) Field of Classification Search
CPC ............. H01L 29/1095; H01L 29/0615; H01L 29/7811; H01L 29/872; H01L 21/0495
See application file for complete search history.

(56) References Cited

U.S. PATENT DOCUMENTS 5,169,793 A    12/1992    Okabe et al.
5,464,992 A    11/1995    Okabe et al.
(Continued)

FOREIGN PATENT DOCUMENTS

JP    4-229661 A    8/1992
JP    2001-94095 A    4/2001
(Continued)

OTHER PUBLICATIONS

International Search Report dated May 17, 2016 in PCT/JP2016/061706 filed Apr. 11, 2016.

*Primary Examiner* — Marcos D. Pizarro
*Assistant Examiner* — Quinton A Brasfield
(74) *Attorney, Agent, or Firm* — Xsensus LLP

(57) ABSTRACT

A technique is provided for effectively suppressing a forward voltage shift due to occurrence of a stacking fault. A semiconductor device relating to the present technique includes a first well region of a second conductivity type, a second well region of the second conductivity type which is so provided as to sandwich the whole of a plurality of first well regions in a plan view and has an area larger than that of each of the first well regions, a third well region of the second conductivity type which is so provided as to sandwich the second well region in a plan view and has an area
(Continued)

larger than that of the second well region, and a dividing region of a first conductivity type provided between the second well region and the third well region, having an upper surface which is in contact with an insulator.

12 Claims, 12 Drawing Sheets

(51) Int. Cl.
  *H01L 29/12* (2006.01)
  *H01L 27/04* (2006.01)
  *H01L 27/095* (2006.01)
  *H01L 29/10* (2006.01)
  *H01L 29/16* (2006.01)
  *H01L 29/872* (2006.01)

(52) U.S. Cl.
  CPC .......... *H01L 29/06* (2013.01); *H01L 29/0615* (2013.01); *H01L 29/1095* (2013.01); *H01L 29/12* (2013.01); *H01L 29/1608* (2013.01); *H01L 29/78* (2013.01); *H01L 29/872* (2013.01)

(56) References Cited

U.S. PATENT DOCUMENTS

| | | | |
|---|---|---|---|
| 8,492,836 B2 * | 7/2013 | Miura | H01L 29/1095 257/339 |
| 8,513,735 B2 * | 8/2013 | Nakata | H01L 29/0619 257/341 |
| 2013/0168700 A1 * | 7/2013 | Furukawa | H01L 29/78 257/77 |
| 2015/0236012 A1 | 8/2015 | Hino et al. | |
| 2015/0340443 A1 * | 11/2015 | Wada | H01L 29/0688 257/77 |
| 2016/0079411 A1 * | 3/2016 | Hino | H01L 29/0615 257/77 |
| 2018/0097103 A1 * | 4/2018 | Sadamatsu | H01L 22/14 |

FOREIGN PATENT DOCUMENTS

| | | |
|---|---|---|
| JP | 2003-17701 A | 1/2003 |
| JP | 2004-289023 A | 10/2004 |
| WO | WO 2014/038110 A1 | 3/2014 |
| WO | WO 2014/162969 A1 | 10/2014 |
| WO | WO-2014162969 A1 * | 10/2014 ............ H01L 29/12 |

* cited by examiner

SEMICONDUCTOR DEVICE

TECHNICAL FIELD

The technique disclosed in the specification of the present application relates to a semiconductor device.

BACKGROUND ART

Well known is a problem of reliability, in which a stacking fault occurs in a crystal and a forward voltage is thereby shifted when a forward current is continuously carried in a pn diode made of silicon carbide (SiC).

It is thought that this is because the stacking fault which is a plane defect is extended with a basal plane dislocation or the like existing in a silicon carbide semiconductor substrate, as a starting point due to a recombination energy generated when minority carriers injected through the pn diode are recombined with majority carriers. Since this stacking fault inhibits a flow of currents, flowing currents are reduced. Then, when the stacking fault increases the forward voltage, this causes reliability degradation of a semiconductor device.

It is reported that such a forward voltage shift also occurs in a metal-oxide-semiconductor field-effect transistor (MOSFET) using silicon carbide. A MOSFET (SiC-MOSFET) structure has a parasitic pn diode (body diode) between a source and a drain, and when the forward current is carried in the body diode, this causes reliability degradation like in the pn diode.

On the other hand, a semiconductor device which is a unipolar transistor such as the MOSFET or the like incorporates a unipolar diode as a reflux diode and can use the diode. Patent Document 1 (Japanese Patent Application Laid-Open No. 2003-017701) or Patent Document 2 (WO 2014/038110), for example, proposes a method of incorporating a Schottky barrier diode (SBD) as the unipolar diode in a unit cell of the MOSFET and using the diode.

In such a unipolar transistor incorporating the unipolar diode, i.e., a diode energized only by the majority carriers in an active region, by designing a diffusion potential of the unipolar diode, i.e., a voltage at which an energizing operation starts to be lower than that of a pn junction, no forward current is carried in the body diode during actual use and it is thereby possible to suppress characteristic degradation of the active region.

PRIOR ART DOCUMENTS

Patent Documents

[Patent Document 1] Japanese Patent Application Laid-Open No. 2003-017701
[Patent Document 2] WO 2014/038110

SUMMARY

Problem to be Solved by the Invention

Even in the unipolar transistor incorporating the unipolar diode in the active region, however, in a terminal region, i.e., a region other than the active region, there is a portion in which the parasitic pn diode is formed, which is a portion in which no diode can be disposed for structural reasons.

As an example of this case, the MOSFET incorporating the SBD will be described.

A first Schottky electrode is formed in a portion below a source electrode in an active region. Then, the first Schottky electrode gets into contact with a separation region between first well regions in the active region. An SBD is thereby formed.

On the other hand, in a region in the vicinity of a gate pad or a region in the vicinity of an element terminal portion, a second well region protruding toward a terminal region side of the source electrode is formed.

The second well region forms a parasitic pn diode between a drift layer and itself. Further, in a portion where the second well region is formed, the first Schottky electrode is not formed.

During a reflux operation, in other words, when the potential of the source electrode exceeds that of a drain electrode, currents are carried in the built-in SBD in the active region. For this reason, no forward current is carried in a pn diode formed of the first well region and the drift layer.

In this case, an SBD current causes a voltage drop in the drift layer, a semiconductor substrate, or the like. As a result, a voltage exceeding the diffusion potential of the pn junction is generated between the source electrode and the drain electrode.

At that time, since no SBD electrode is formed in the second well region, the voltage of the source electrode and that of the drain electrode are applied to the pn diode formed of the second well region and the drift layer. Then, the forward current is carried in the pn diode.

When a starting point such as a basal plane dislocation or the like is present in such a portion, in some cases, the stacking fault is extended and a breakdown voltage of the transistor is degraded. Specifically, when the transistor is off, a leakage current is generated and the element or the circuit is broken due to heat generation.

In order to avoid this problem, an applied voltage between the source and the drain is limited to not higher than a constant value so that a bipolar current should not be carried in the pn diode formed of the second well region and the drift layer. Specifically, by increasing the chip size, reduced is the voltage generated between the source and the drain when a circulating current is carried. This case is accompanied with a disadvantage of increasing the cost due to an increase in the chip size.

As a method of suppressing a forward operation of the pn diode formed of the second well region and the drift layer without increasing the chip size, there is a possible method of increasing the resistance of an energization path formed between the second well region and the source electrode.

Specifically, a method of increasing a contact resistance between the second well region and the source electrode, another method of connecting the second well region and the source electrode with an external resistor, still another method of increasing a sheet resistance of the second well region, and the like, may be used.

By performing any one of these methods, when such a very small forward current is carried as not to allow the stacking fault to grow in the pn diode formed of the second well region and the drift layer, a voltage drop is caused due to a resistance element. For this reason, the potential of the second well region diverges from a source potential, and a forward voltage to be applied to the pn diode is reduced by the divergence. It is thereby possible to suppress energization of the forward current.

On the other hand, in a wide-gap semiconductor device typically of silicon carbide, there is a problem in which the element is broken due to a displacement current. This is caused by, for example, a change in the potential of the second well region due to the displacement current flowing in a chip plane direction inside the second well region and the sheet resistance of the second well region at the time when a silicon carbide semiconductor device having a MOS structure performs a switching.

In a case, for example, where the potential of the second well region changes to not lower than 50 V and a gate oxide film having a thickness of 50 nm and a gate electrode of substantially 0 V are formed on an upper surface of the second well region, a high electric field of 10 MV/cm, for example, is applied to the gate oxide film. As a result, the gate oxide film is broken.

The reason why this problem characteristically arises in the wide-gap semiconductor device typically of silicon carbide is owing to the following two causes.

One reason is because the impurity level of the well region formed in silicon carbide is deeper than that of a well region formed in silicon and therefore, the sheet resistance is significantly higher.

Another reason is because the impurity concentration of the drift layer is designed to be high since the drift layer of low resistance is formed, taking an advantage of high dielectric breakdown electric field of a wide-gap semiconductor in the wide-gap semiconductor device, as compared with in a silicon semiconductor device. When the impurity concentration of the drift layer is designed to be high, consequently, a depletion capacitance between the source and the drain becomes significantly high. Then, when the switching is performed, a large displacement current is generated.

As a switching speed increases, the displacement current becomes larger, and accordingly a generated voltage in the second well region becomes higher. For this reason, in order to avoid the above-described problem, the switching speed should be reduced, but in this case, a switching loss disadvantageously increases.

In order to prevent an element temperature from increasing to an intolerable high temperature due to an increase in the element loss, it is necessary to increase the chip size and thereby reduce the element loss, and as a result, a high-cost chip is needed.

In order to avoid the element destruction during the switching without reducing the switching speed, it is desirable to reduce the resistance between each portion in the second well region and the source electrode, and specifically, a method of reducing the contact resistance between the second well region and the source electrode or another method of reducing the sheet resistance of the second well region may be used.

Thus, in the unipolar transistor incorporating the unipolar diode in its active region, which is a semiconductor device using the wide-gap semiconductor, there are two contradictory circumstances, i.e., one is a circumstance requiring a decrease in the sheet resistance in the second well region in order to increase the reliability of the element and the other is a circumstance requiring an increase in the sheet resistance.

The technique disclosed in the specification of the present application is intended to solve the above-described problems, and relates to a technique for effectively suppressing a forward voltage shift due to occurrence of a stacking fault.

Means to Solve the Problem

One aspect of the technique disclosed in the specification of the present application includes a drift layer of a first conductivity type which is a wide-gap semiconductor layer provided on an upper surface of a semiconductor substrate of the first conductivity type, a plurality of first well regions each of a second conductivity type provided, being separated from one another in a surface layer of the drift layer, a first separation region of the first conductivity type provided penetrating from a surface layer of each of the first well regions in a depth direction, a source region of the first conductivity type provided in the surface layer of each of the first well regions, a first Schottky electrode provided on an upper surface of the first separation region, a first ohmic electrode provided at least partially in a surface layer of the source region, a second well region of the second conductivity type which is so provided in the surface layer of the drift layer as to sandwich the whole of the plurality of first well regions in a plan view and has an area larger than that of each of the first well regions, a third well region of the second conductivity type which is so provided in the surface layer of the drift layer as to sandwich the second well region in a plan view and has an area larger than that of the second well region, a second ohmic electrode provided in part of the second well region, a dividing region of the first conductivity type provided between the second well region and the third well region, having an upper surface which is in contact with an insulator, and a source electrode connected to the first Schottky electrode, the first ohmic electrode, and the second ohmic electrode.

Effects of the Invention

One aspect of the technique disclosed in the specification of the present application includes a drift layer of a first conductivity type which is a wide-gap semiconductor layer provided on an upper surface of a semiconductor substrate of the first conductivity type, a plurality of first well regions each of a second conductivity type provided, being separated from one another in a surface layer of the drift layer, a first separation region of the first conductivity type provided penetrating from a surface layer of each of the first well regions in a depth direction, a source region of the first conductivity type provided in the surface layer of each of the first well regions, a first Schottky electrode provided on an upper surface of the first separation region, a first ohmic electrode provided at least partially in a surface layer of the source region, a second well region of the second conductivity type which is so provided in the surface layer of the drift layer as to sandwich the whole of the plurality of first well regions in a plan view and has an area larger than that of each of the first well regions, a third well region of the second conductivity type which is so provided in the surface layer of the drift layer as to sandwich the second well region in a plan view and has an area larger than that of the second well region, a second ohmic electrode provided in part of the second well region, a dividing region of the first conductivity type provided between the second well region and the third well region, having an upper surface which is in contact with an insulator, and a source electrode connected to the first Schottky electrode, the first ohmic electrode, and the second ohmic electrode. With such a structure, it is possible to effectively suppress the forward voltage shift due to occurrence of the stacking fault.

These and other objects, features, aspects and advantages of the present invention will become more apparent from the following detailed description of the present invention when taken in conjunction with the accompanying drawings.

DESCRIPTION OF EMBODIMENT(S)

Hereinafter, with reference to attached figures, description will be made on the preferred embodiments.

Figures are schematically shown, and the correlation in the size and position among images shown in different figures is not always represented accurately but may be changed as appropriate.

Further, in the following description, identical constituent elements are represented by the same reference signs and each have the same name and function. Therefore, detailed description thereof will be omitted in some cases.

Furthermore, in the following description, even in a case of using words such as "upper", "lower", "side", "bottom", "front", "back", and the like, which mean specific positions and directions, these words are used for convenience to easily understand the contents of the preferred embodiments, and have no relation to actual directions used when the embodiments are carried out.

The First Preferred Embodiment

Hereinafter, a semiconductor device in accordance with the present preferred embodiment will be described. For convenience of description, first, a MOSFET incorporating an SBD will be described.

Figure 10:
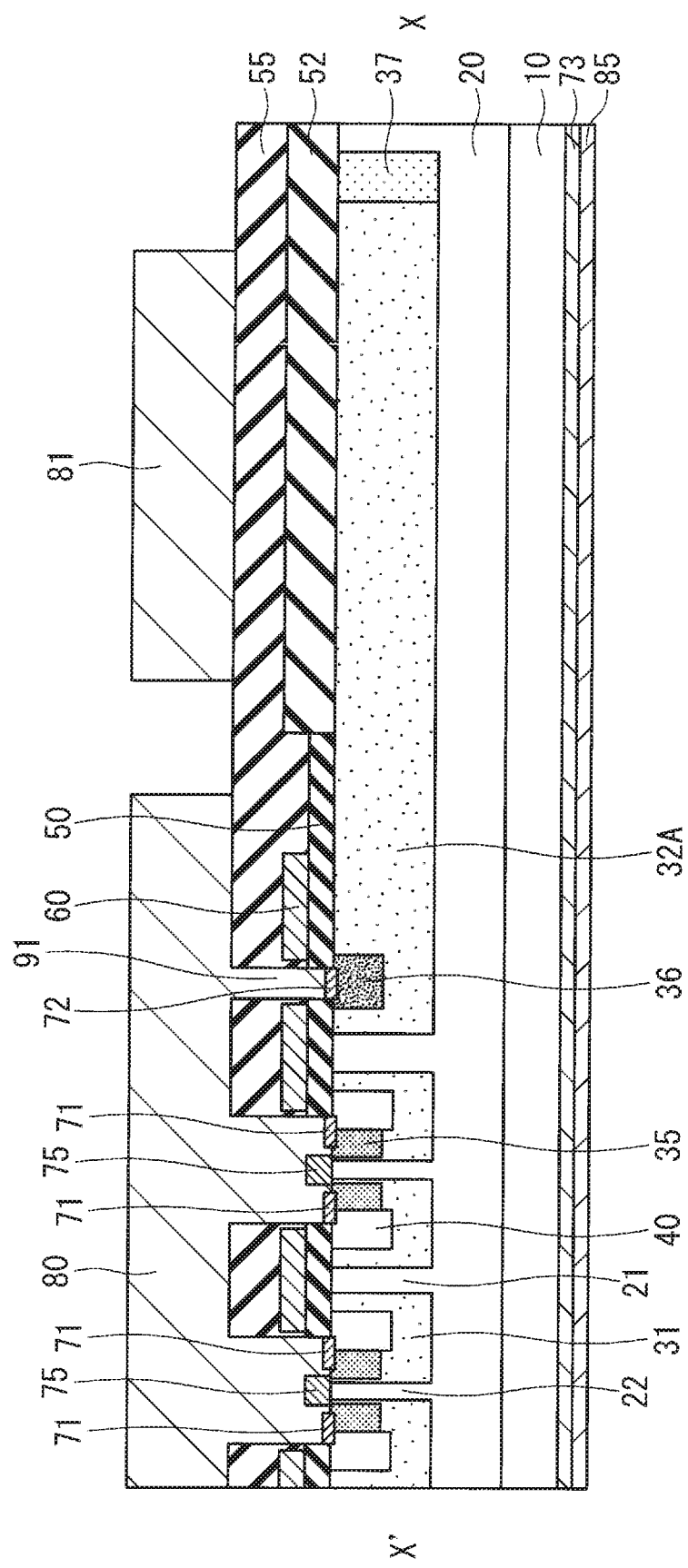
FIG. 10 is a cross section schematically illustrating a structure in the vicinity of a gate pad in the semiconductor device in accordance with the preferred embodiment.
Figure 11:
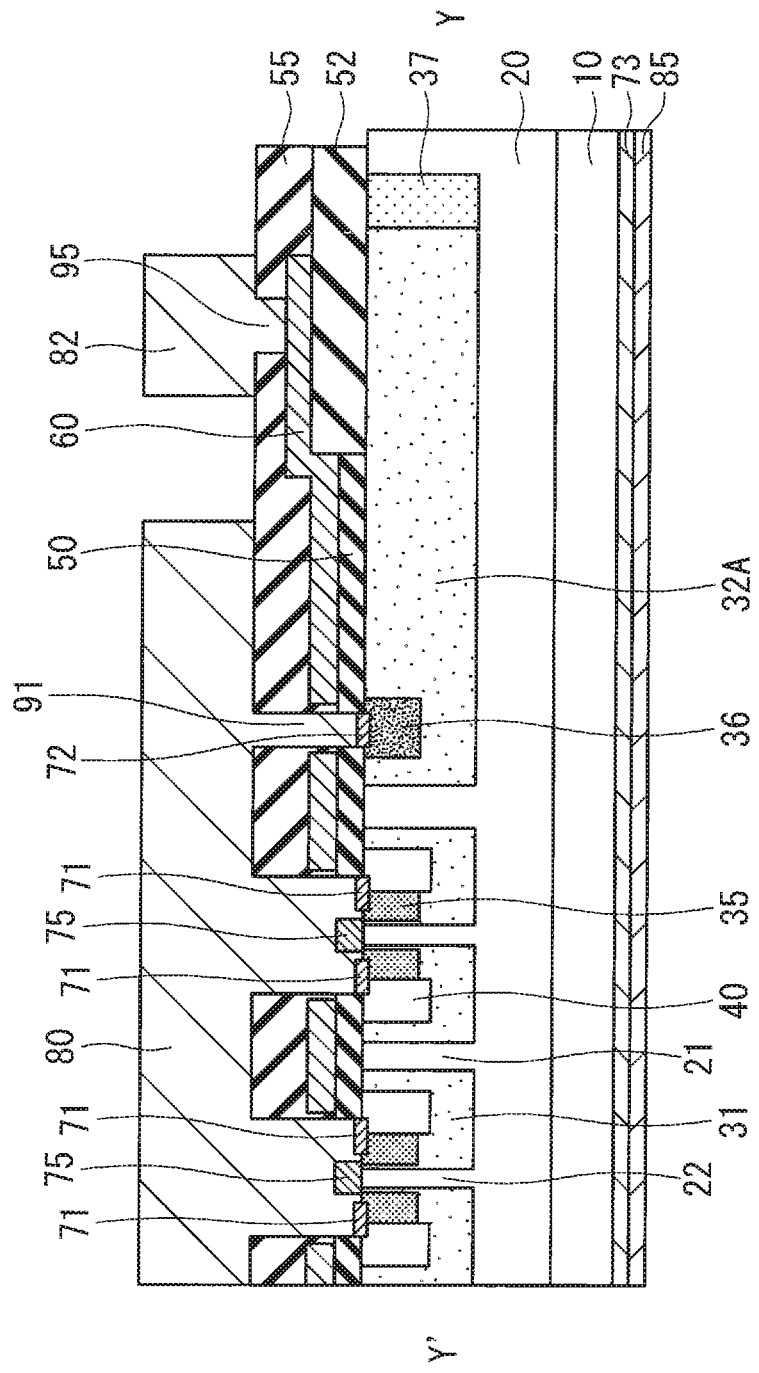
FIG. 11 is a cross section schematically illustrating a structure in the vicinity of an element peripheral portion in the semiconductor device in accordance with the preferred embodiment.
Figure 12:
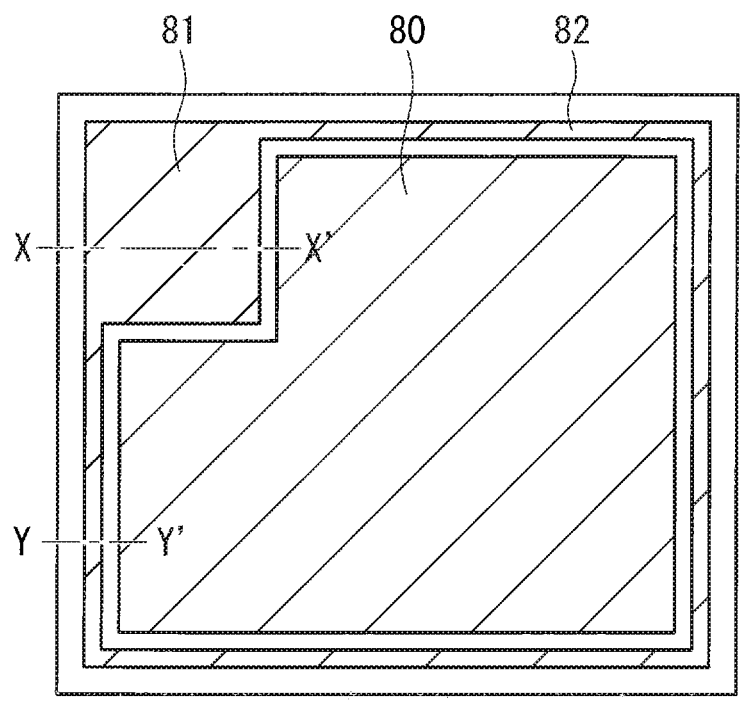
FIG. 12 is a plan view schematically illustrating a structure of the semiconductor device in accordance with the preferred embodiment.

FIG. 10 is a cross section schematically illustrating a structure in the vicinity of a gate pad in the semiconductor device in accordance with the present preferred embodiment. FIG. 11 is a cross section schematically illustrating a structure in the vicinity of an element peripheral portion in the semiconductor device in accordance with the present preferred embodiment. FIG. 12 is a plan view schematically illustrating a structure of the semiconductor device in accordance with the present preferred embodiment.

Herein, FIG. 10 corresponds to an X-X' cross section of FIG. 12. Further, FIG. 11 corresponds to a Y-Y' cross section of FIG. 12.

As exemplarily illustrated in FIGS. 10 and 11, the semiconductor device includes an n-type drift layer 20 formed on an upper surface of an n-type semiconductor substrate 10. Further, the semiconductor device includes a back ohmic electrode 73 formed on a lower surface of the n-type semiconductor substrate 10. Furthermore, the semiconductor device includes a drain electrode 85 formed on a lower surface of the back ohmic electrode 73.

Then, in an active region, well regions 31 are formed in a surface layer of the n-type drift layer 20. In a surface layer of the well region 31, a source region 40 and a high concentration well injection region 35 are formed.

Then, a gate insulating film 50 is formed across an upper surface of a separation region 21 which is a region between adjacent two of the plurality of well regions 31. Further, a gate electrode 60 is formed on an upper surface of the gate insulating film 50. Furthermore, an interlayer insulating film 55 is so formed as to cover the gate electrode 60.

On the other hand, a first Schottky electrode 75 is formed across an upper surface of another separation region 22 which is a region between other adjacent two of the plurality of well regions 31. Further, a first ohmic electrode 71 is so formed as to sandwich the first Schottky electrode 75 in the cross sections exemplarily illustrated in FIGS. 10 and 11. The first ohmic electrode 71 is formed across a surface layer of the source region 40 and a surface layer of the high concentration well injection region 35.

Then, a source electrode 80 is so formed as to cover the interlayer insulating film 55, the first ohmic electrode 71, and the first Schottky electrode 75.

Further, on a terminal region side in FIG. 10, i.e., on the side of a gate pad 81, a well region 32A is formed in the surface layer of the n-type drift layer 20. In a surface layer of the well region 32A, a high concentration well injection region 36 is formed.

Then, in a surface layer of the high concentration well injection region 36, a second ohmic electrode 72 is formed. The source electrode 80 is so formed in a well contact hole 91 as to also cover the second ohmic electrode 72.

Further, on the terminal region side of the well region 32A in a plan view in the surface layer of the n-type drift layer 20, a junction termination extension (JTE) region 37 is formed.

Furthermore, across an upper surface of the well region 32A and an upper surface of the JTE region 37, a field insulating film 52 is formed. The interlayer insulating film 55 is so formed as to also cover the field insulating film 52.

Further, on an upper surface of the interlayer insulating film 55 on the terminal region side, the gate pad 81 is formed.

Furthermore, on the terminal region side, i.e., on the side of a gate wire 82 in FIG. 11, in the surface layer of the n-type drift layer 20, the well region 32A is formed. In a surface layer of the well region 32A, the high concentration well injection region 36 is formed.

Then, in the surface layer of the high concentration well injection region 36, the second ohmic electrode 72 is formed. The source electrode 80 is so formed in the well contact hole 91 as to also cover the second ohmic electrode 72.

Further, on the terminal region side of the well region 32A in a plan view in the surface layer of the n-type drift layer 20, the JTE region 37 is formed.

Furthermore, across the upper surface of the well region 32A and the upper surface of the JTE region 37, the field insulating film 52 is formed. The interlayer insulating film 55 is so formed as to also cover the field insulating film 52.

Further, on the upper surface of the interlayer insulating film 55 on the terminal region side, the gate wire 82 is formed. The gate wire 82 covers the gate electrode 60 in a gate contact hole 95.

The first Schottky electrode 75 is formed in a portion below the source electrode 80. Then, the first Schottky electrode 75 gets into contact with the separation region 22 formed by partially chipping the well region 31. An SBD is thereby formed.

On the other hand, in a region in the vicinity of the gate pad 81 exemplarily illustrated in FIG. 10 or a region in the vicinity of an element terminal portion exemplarily illustrated in FIG. 11, the well region 32A protruding toward the terminal region side of the source electrode 80 is formed.

The well region 32A forms a parasitic pn diode between the drift layer 20 and itself. Further, in a portion where the well region 32A is formed, the first Schottky electrode 75 is not formed.

During a reflux operation, in other words, when the potential of the source electrode 80 exceeds that of the drain electrode 85, currents are carried in the built-in SBD in the active region. For this reason, no forward current is carried in a pn diode formed of the well region 31 and the drift layer 20.

In this case, an SBD current causes a voltage drop in the separation region 22, the drift layer 20, the semiconductor substrate 10, or the like. As a result, a voltage exceeding the diffusion potential of the pn junction is generated between the source electrode 80 and the drain electrode 85.

At that time, since no SBD electrode is formed in the well region 32A, the voltage of the source electrode 80 and that of the drain electrode 85 are applied to the pn diode formed of the well region 32A and the drift layer 20. Then, the forward current is carried in the pn diode.

When a starting point such as a basal plane dislocation or the like is present in such a portion, in some cases, the stacking fault is extended and a breakdown voltage of the transistor is degraded. Specifically, when the transistor is off, a leakage current is generated and the element or the circuit is broken due to heat generation.

In order to avoid this problem, an applied voltage between the source and the drain is limited to not higher than a constant value so that a bipolar current should not be carried in the pn diode formed of the well region 32A and the drift layer 20. Specifically, by increasing the chip size, reduced is the voltage generated between the source and the drain when a circulating current is carried. This case is accompanied with a disadvantage of increasing the cost due to an increase in the chip size.

As a method of suppressing a forward operation of the pn diode formed of the well region 32A and the drift layer 20 without increasing the chip size, there is a possible method of increasing the resistance of an energization path formed between the well region 32A and the source electrode 80.

Specifically, a method of increasing a contact resistance between the well region 32A and the source electrode 80, another method of connecting the well region 32A and the source electrode 80 with an external resistor, still another method of increasing a sheet resistance of the well region 32A, and the like, may be used.

By performing any one of these methods, when such a very small forward current is carried as not to allow the stacking fault to grow in the pn diode formed of the well region 32A and the drift layer 20, a voltage drop is caused due to a resistance element. For this reason, the potential of the well region 32A diverges from a source potential, and a forward voltage to be applied to the pn diode is reduced by the divergence. It is thereby possible to suppress energization of the forward current.

On the other hand, in a wide-gap semiconductor device typically of silicon carbide, there is a problem in which the element is broken due to a displacement current. This is caused by, for example, a change in the potential of the well region 32A due to the displacement current flowing in a chip plane direction inside the well region 32A and the sheet resistance of the well region 32A at the time when a silicon carbide semiconductor device having a MOS structure performs a switching.

In a case, for example, where the potential of the well region 32A changes to not lower than 50 V and a gate oxide film having a thickness of 50 nm and the gate electrode 60 of substantially 0 V are formed on an upper surface of the well region 32A, a high electric field of 10 MV/cm, for example, is applied to the gate oxide film. As a result, the gate oxide film is broken.

The reason why this problem characteristically arises in the wide-gap semiconductor device typically of silicon carbide is owing to the following two causes.

One reason is because the impurity level of the well region formed in silicon carbide is deeper than that of a well region formed in silicon and therefore, the sheet resistance is significantly higher.

Another reason is because the impurity concentration of the drift layer 20 is designed to be high since the drift layer 20 of low resistance is formed, taking an advantage of high dielectric breakdown electric field of the wide-gap semiconductor in the wide-gap semiconductor device, as compared with in a silicon semiconductor device. When the impurity concentration of the drift layer 20 is designed to be high, consequently, a depletion capacitance between the source and the drain becomes significantly high. Then, when the switching is performed, a large displacement current is generated.

As a switching speed increases, the displacement current becomes larger, and accordingly a generated voltage in the well region 32A becomes higher. For this reason, in order to avoid the above-described problem, the switching speed should be reduced, but in this case, a switching loss disadvantageously increases.

In order to prevent an element temperature from increasing to an intolerable high temperature due to an increase in the element loss, it is necessary to increase the chip size and thereby reduce the element loss, and as a result, a high-cost chip is needed.

In order to avoid the element destruction during the switching without reducing the switching speed, it is desirable to reduce the resistance between each portion in the well region 32A and the source electrode 80, and specifically, a method of reducing the contact resistance between the well region 32A and the source electrode 80 or another method of reducing the sheet resistance of the well region 32A may be used.

Thus, in the unipolar transistor incorporating the unipolar diode in its active region, which is a semiconductor device using the wide-gap semiconductor, there are two contradictory circumstances, i.e., one is a circumstance requiring a decrease in the sheet resistance in the well region 32A in order to increase the reliability of the element and the other is a circumstance requiring an increase in the sheet resistance.

<Structure of Semiconductor Device>

In the preferred embodiments described in the specification of the present application, description will be made, taking an n-channel silicon carbide MOSFET which is a silicon carbide (SiC) semiconductor device, in which the first conductivity type is n type and the second conductivity type is p type, as one example of a semiconductor device. At some midpoint in the following description, the level (high or low) of a potential will be described, and in a case where it is assumed that the first conductivity type is p type and the second conductivity type is n type, the description on the level (high or low) of the potential is also a converse one.

In the specification of the present application, in the whole of a semiconductor device, it is assumed that a region in which unit cells are periodically aligned is an active region and another region other than the active region is a terminal region.

Figure 1:
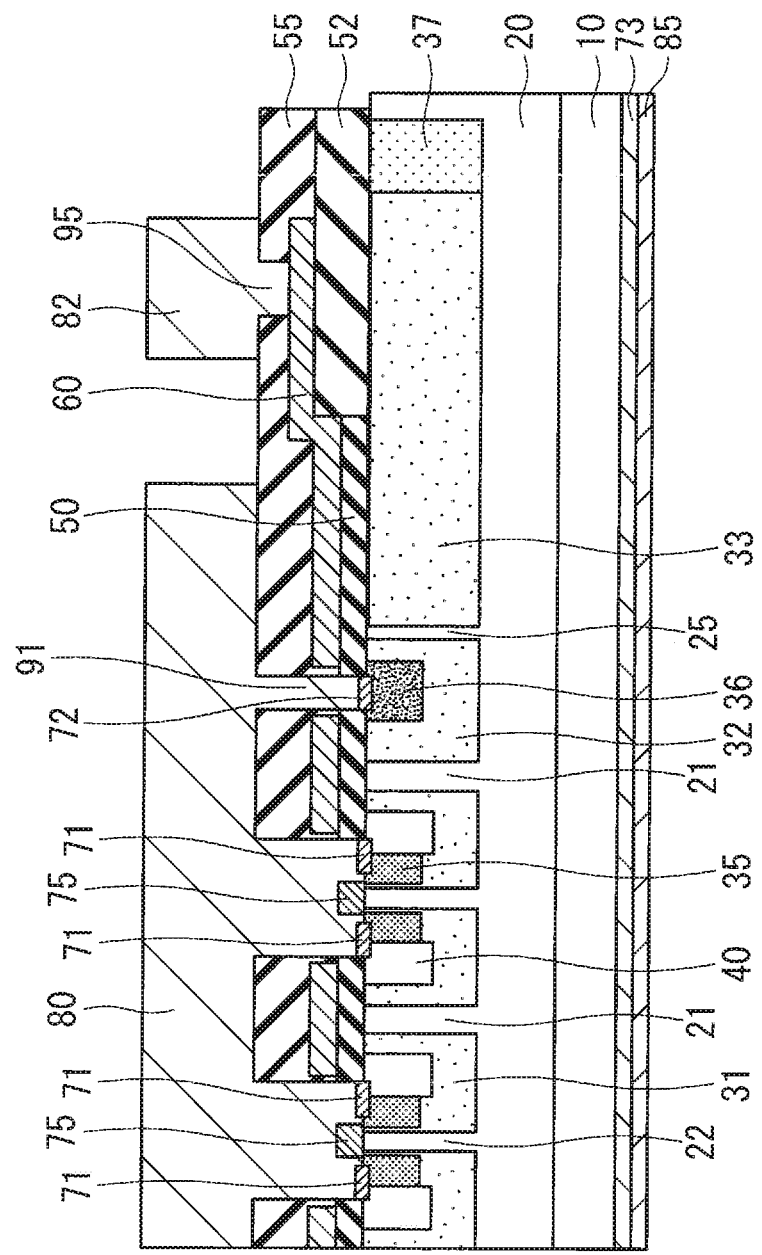
FIG. 1 is a cross section schematically illustrating a structure for realizing a semiconductor device in accordance with a preferred embodiment.
Figure 2:
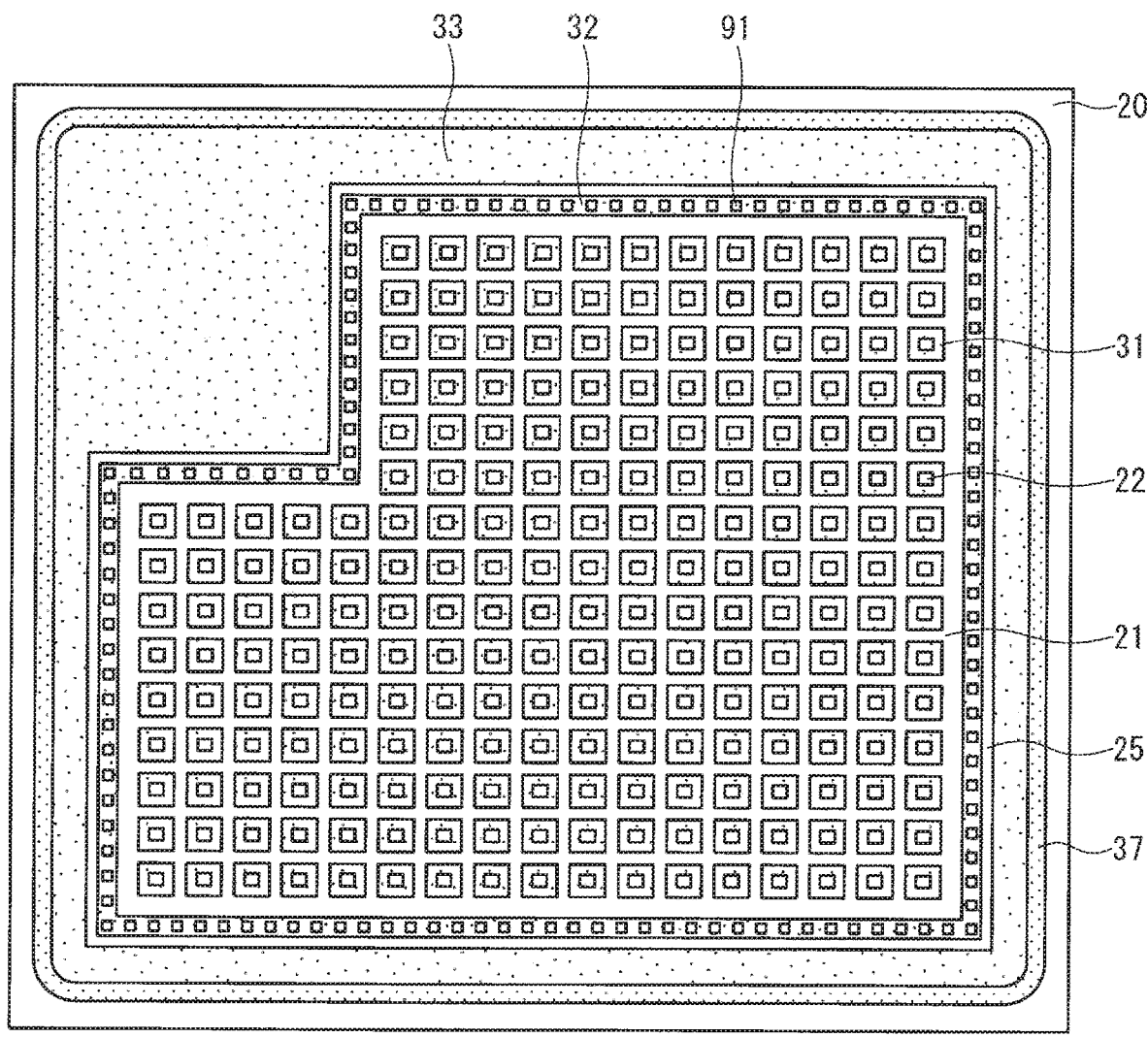
FIG. 2 is a plan view schematically illustrating a structure for realizing the semiconductor device in accordance with the preferred embodiment.

A structure of a semiconductor device in accordance with the present preferred embodiment will be described. FIG. 1 is a cross section schematically illustrating a structure for realizing the semiconductor device in accordance with the present preferred embodiment. FIG. 2 is a plan view schematically illustrating a structure for realizing the semiconductor device in accordance with the present preferred embodiment.

As exemplarily illustrated in FIG. 1, on a first main surface of a semiconductor substrate 10 made of n-type (first conductivity type) silicon carbide of low resistance, which has 4H polytype, formed is a drift layer 20 made of n-type (first conductivity type) silicon carbide. In the semiconductor substrate 10 made of silicon carbide, the first main surface is a (0001) plane in plane orientation and the first main surface is inclined by 4 degrees with respect to a c-axis direction.

The drift layer 20 has a first impurity concentration of n type (first conductivity type). On a second main surface of the semiconductor substrate 10, which is a surface opposite to the first main surface, i.e., on a back surface side, a drain electrode 85 is formed with a back ohmic electrode 73 interposed therebetween.

First, a structure of the active region exemplarily illustrated on the left side of FIG. 1 will be described.

In a surface layer of the drift layer 20, formed is a p-type (second conductivity type) well region 31 containing aluminum (Al) which is a p-type (second conductivity type) impurity. The well region 31 has a second impurity concentration of p type (second conductivity type).

The well region 31 is separated at two positions in a cross section inside the unit cell, and one is referred to as a separation region 21 and the other is referred to as a separation region 22. Specifically, the separation regions 21 and 22 are n-type (first conductivity type) regions in the surface layer of the drift layer 20. The separation region 22 is formed, penetrating from a surface layer of the well region 31 in a depth direction.

In a cross section of FIG. 1, on a surface layer side inside each well region 31, formed is an n-type (first conductivity type) source region 40 containing nitrogen (N) which is an n-type (first conductivity type) impurity. The depth in which the source region 40 is formed is shallower than the depth in which the well region 31 is formed.

Further, on the surface layer side of the drift layer 20, preferably in a region between the source region 40 and the separation region 22, formed is a p-type (second conductivity type) high concentration well injection region 35 containing aluminum (Al) which is a p-type (second conductivity type) impurity.

Further, across an upper surface of the separation region 21, an upper surface of the well region 31, and part of an upper surface of the source region 40, formed is a gate insulating film 50 made of silicon oxide.

Further, at a position in an upper surface of the gate insulating film 50 corresponding to the separation region 21, the well region 31, and an end portion of the source region 40, formed is a gate electrode 60. Specifically, the gate electrode 60 is formed on the upper surface of the well region 31 between the source region 40 and the drift layer 20, with the gate insulating film 50 interposed therebetween.

The region in the well region 31 which is sandwiched between the separation region 21 and the source region 40 and positioned below the gate electrode 60 with the gate insulating film 50 interposed therebetween is referred to as a channel region. The channel region is a region in which an inversion layer is formed when an on operation is performed.

On an upper surface of the gate insulating film 50, an interlayer insulating film 55 of silicon oxide is so formed as to cover the gate electrode 60.

On an upper surface of a region in the source region 40, which is not covered with the gate insulating film 50, and part of an upper surface of the high concentration well injection region 35 on the side in contact with the source region 40, formed is a first ohmic electrode 71 for reducing a contact resistance with the silicon carbide.

Further, the well region 31 can easily give and receive electrons or positive holes to/from the first ohmic electrode 71 through the high concentration well injection region 35 of low resistance.

On an upper surface of the separation region 22, formed is a first Schottky electrode 75. The first Schottky electrode 75 and the upper surface of the drift layer 20 corresponding to the separation region 22 are Schottky-connected to each other.

It is desirable that the first Schottky electrode 75 should contain at least the upper surface of the separation region 22, but the first Schottky electrode 75 may not contain the upper surface of the separation region 22.

On an upper surface of the first ohmic electrode 71, an upper surface of the first Schottky electrode 75, and an upper surface of the interlayer insulating film 55, formed is a source electrode 80. The source electrode 80 electrically short-circuits the first ohmic electrode 71 and the first Schottky electrode 75. Specifically, the first ohmic electrode 71 and the first Schottky electrode 75 are electrically connected to each other. A diffusion potential of an SBD formed by the contact of the first Schottky electrode 75 and the separation region 22 is lower than that of pn junction.

Next, a structure of the terminal region exemplarily illustrated on the right side of FIG. 1 will be described.

In FIG. 1, around the active region in a plan view, formed is a p-type well region 32 with an interval of an n-type region, which is almost the same space as the separation region 21, from the well region 31 in an outermost unit cell. The formation area of the well region 32 is larger than that of the well region 31.

Further, an n-type dividing region 25 is formed, being adjacent to the well region 32 from the terminal region side. An insulator is in contact with an upper surface of the dividing region 25.

Then, a p-type well region 33 is formed, being adjacent to the n-type dividing region 25 from the terminal region side. The well region 33 is formed, sandwiching the well region 32 in a plan view. The formation area of the well region 33 is larger than that of the well region 32.

On at least part of an upper surface of the well region 33, formed is a field insulating film 52 having a film thickness larger than that of the gate insulating film 50.

The gate electrode 60 extends up to a position corresponding to above the well region 33 from the active region and is formed across the gate insulating film 50 on the upper surface of the well region 33 and the field insulating film 52 on the upper surface of the well region 33.

Then, in a region in which the field insulating film 52 is present, the gate electrode 60 and a gate wire 82 are in contact with each other with a gate contact hole 95 opened in the interlayer insulating film 55.

Further, a gate pad 81 or the gate wire 82 is included in the well region 33 in a plan view. This is intended to prevent a high voltage from being applied to the field insulating film 52 below the gate wire 82 which is a wire having a potential which is significantly lower than a drain voltage because the well region 33 shields the high voltage to be applied to the drain electrode 85.

Furthermore, the gate electrode 60 is included in a region including all of the well region 31, the well region 32, the well region 33, the separation region 21, and the dividing region 25 in a plan view. It is thereby possible to prevent the high voltage from being applied to the gate insulating film 50 or the field insulating film 52 formed below the gate electrode 60.

Though the separation region 21 and the dividing region 25 are each n type, since a depletion layer extends into each of the n-type regions from the nearby well region, it is possible to prevent the high voltage from being applied to the gate insulating film 50 or the field insulating film 52 formed on the upper surfaces thereof.

In the terminal region side (element peripheral portion side) of the well region 33, formed is a p-type JTE region 37 having an impurity concentration lower than that of the well region 33. The JTE region 37 is connected to the well region 33.

The well region 32 is connected to the source electrode 80 in a well contact hole 91 opened in the gate insulating film 50 and the interlayer insulating film 55. Herein, in order to prevent the gate electrode 60 from being brought into contact with the source electrode 80, the gate electrode 60 is partially removed in a portion in which the well contact hole 91 is formed.

In a portion of the well contact hole 91, in which the layer of silicon carbide and the source electrode 80 are in contact with each other, formed is a second ohmic electrode 72.

In the surface layer of the well region 32 which is in contact with the second ohmic electrode 72, formed is a high concentration well injection region 36. The high concentration well injection region 36 reduces a contact resistance between the second ohmic electrode 72 and the well region 32, like the high concentration well injection region 35.

On the other hand, the well region 33 is not ohmic-connected to the source electrode 80 directly or even through the high concentration well injection region of the same p type.

Further, the dividing region 25 has an upper surface in contact with the gate insulating film 50 and a lower surface connected to the n-type drift layer 20. For this reason, there is no conducting path through a p type or a conductor from the well region 32 toward the well region 33. In other words, there is no conductive path serving as ohmic from the well region 33 to the source electrode 80.

With such a structure, the electrical conduction between the well region 33 and the source electrode 80 is performed through the dividing region 25.

The well region 32, the dividing region 25, and the well region 33 form a contact structure of pnp in a plane direction. Since there is reverse bias of the pn junction inside an energization path in any voltage direction, it is generally recognized that no current is carried. Actually, however, in a case where the width of the dividing region 25 is reduced, energization can be performed by applying a predetermined voltage.

This is because a phenomenon termed punch through occurs, in which a band barrier for majority carrier formed in an junction interface B disappears and energization is caused when a depletion layer extending from a junction interface A between the dividing region 25 and either one of the well regions toward the inside of the dividing region 25 reaches the junction interface B between the dividing region 25 and the other well region. Therefore, shown is the characteristic that until a punch through voltage is applied, almost no current is carried but when a voltage exceeding the punch through voltage is applied, currents abruptly flow.

Assuming that the impurity concentration of the well region 32 and that of the well region 33 are each higher than that of the dividing region 25, the punch through voltage is derived as follows:

$$\frac{d^2\phi}{dx^2} = -\frac{qN}{\varepsilon} \tag{1}$$

from the above one-dimensional Poisson's equation, as the solution of x=W;

$$V = \frac{qNW^2}{(2\varepsilon)} \tag{2}$$

In the equations, "q" represents an elementary electric charge, "N" represents an effective impurity concentration of the dividing region 25, "W" represents a width of the dividing region 25, "ε" represents a dielectric constant of the semiconductor. The width of the dividing region 25 refers to the width in a direction connecting the well region 32 and the well region 33 and the width in the left and right direction of FIG. 1.

Further, though there may be a structure in which the n-type impurity concentration of the dividing region 25 in the depth direction is not constant, the punch through voltage in this case can be derived by giving the lowest impurity concentration within a range of a region in the dividing region 25 between the well region 32 and the well region 33, having the depth shallower than that of at least one of the well region 32 and the well region 33, as "N" in Eq. (2). This is because the punch through occurs earliest at a portion having the lowest impurity concentration.

Furthermore, the reason why the dividing region 25 is brought into contact with the gate insulating film 50 is because in a case where a conductive structure is formed on the upper surface of the dividing region 25, there is a possibility that a current path which goes around the dividing region 25 and has a short distance and a low resistance may be formed.

In a structure, for example, in which a metal is in contact with the upper surface of the dividing region 25, since conduction occurs through the metal even if the dividing region 25 is formed, the effect of the semiconductor device in accordance with the present preferred embodiment cannot be produced.

Further, though the gate insulating film 50 is taken as an example of the structure formed on the upper surface of the dividing region 25 in the structure of the present preferred embodiment, the field insulating film 52 or the interlayer insulating film 55 may be formed thereon, and any other material may be used only if the structure is a nonconductor.

<Operation of Semiconductor Device>

Next, an operation of the MOSFET incorporating the SBD in accordance with the present preferred embodiment will be described. As an example of a semiconductor material, silicon carbide is taken. In this case, the diffusion potential of the pn junction is substantially 2 V.

<Reflux Operation>

First, a reflux operation will be described. In the reflux operation, the drain voltage becomes lower with respect to the source voltage and a voltage of several V is generated.

Among the well region 32 and the well region 33 in which no SBD is present, in the pn junction in the well region 32 in which the well contact hole 91 is formed, most of the voltage between the source and the drain is applied to the pn junction. For this reason, the forward current is carried in the pn diode.

On the other hand, in the pn junction in the well region 33, since the dividing region 25 is interposed in the current path between the source and the drain, most of the voltage between the source and the drain is applied to the dividing region 25 and it is thereby possible to reduce the voltage to be applied to the pn junction. By designing the voltage to be applied to the pn junction to be lower than 2 V which corresponds to the diffusion potential of the pn junction, it is possible to suppress the forward current from being carried in the pn diode.

Specifically, if the dividing region 25 can cut off the voltage of several V equivalent to the voltage obtained by subtracting the diffusion potential of the pn junction from the generated voltage between the source and the drain, the above-described effect can be produced. In a case where the generated voltage between the source and the drain is 5 V, for example, by designing the punch through voltage of the dividing region 25 to be not lower than 3 V, it is possible to make the forward voltage applied to the pn junction not higher than 2 V at a position farther than the dividing region 25 and prevent forward energization of the pn diode in this region.

Further, also in a case where the punch through voltage of the dividing region 25 is lower than 3 V, it is possible to reduce the voltage to be applied to the pn junction and produce an effect of reducing the forward current in the pn diode and reducing the probability of occurrence of breakdown, to some degree.

As described earlier, the gate electrode 60, the gate pad 81, and the gate wire 82 need to be included in a planar region including the well region 31, the well region 32, the well region 33, the separation region 21, and the dividing region 25 in a plan view.

Specifically, outside the active region, except the dividing region 25 having a small area, the gate electrode 60, the gate pad 81, and the gate wire 82 need to be included in at least one of the well region 32 and the well region 33.

The region in which the well region 32 and the well region 33 are formed needs to include the gate pad 81 wide enough to form a wire bond, a region for forming a contact between the gate pad 81 or the gate wire 82 and the gate electrode 60, and the like. This requires a wide area.

Inside these regions, in order to reduce the area in which the forward energization of the pn diode occurs, it is desirable that the forming position of the dividing region 25 should be closer to the well contact hole 91 and the area of the well region 32 should be as small as possible, instead of increasing the area of the well region 33.

The regions in which it is possible to suppress the forward voltage exceeding the diffusion potential from being applied to the pn junction thereby increase, and it is possible to prevent the forward energization in the pn diode in most regions. Therefore, a semiconductor device with its reliability significantly increased can be obtained. From the above description, it is desirable that the area of the well region 32 should be smaller than that of the well region 33.

<Turn-Off Operation>

Next, a switching state will be described, taking a turn-off operation as an example. As described earlier, during turn-off, the potential of the drain electrode 85 abruptly increases. Then, a holes occur inside the well region 32 and the well region 33.

Then, the above holes go from a pn junction surface formed between the well region 32 and the well region 33, and the drift layer 20 toward the source electrode 80, and the displacement current is thereby carried in the chip plane direction.

At that time, the displacement current generated from the well region 33 goes through the dividing region 25. For this reason, as compared with a case where the dividing region 25 is not present, the generated voltage of the well region 33 increases by a voltage which corresponds to the punch through voltage of the dividing region 25.

Therefore, it is necessary to design the punch through voltage of the dividing region 25 obtained from Eq. (2) to be lower than a dielectric breakdown voltage of the gate insulating film 50 between the well region 33 and the gate pad 81 serving as a gate potential, between the well region 33 and the gate wire 82, or between the well region 33 and the gate electrode 60.

Herein, for the gate insulating film 50 of the MOSFET using silicon carbide, generally, silicon oxide having a thickness of about 50 nm is used. In this case, since the dielectric breakdown electric field of silicon oxide is about 10 MV/cm, the withstand voltage is about 50 V.

Specifically, in a case where the gate insulating film 50 between the well region 33 and the gate electrode 60 is formed, it is necessary to set V in Eq. (2) to be not higher than 50 V.

Further, when a high electric field exceeding half of the dielectric breakdown electric field is applied to an insulating film, considering the possibility of degradation of the reliability, it is further desirable to set V in Eq. (2) to be not hither than half of the dielectric breakdown voltage of the gate insulating film 50, i.e., not higher than 25 V.

Thus, by forming the dividing region 25 between the well region 32 and the well region 33 and designing the punch through voltage thereof to be higher than a value obtained by subtracting the diffusion potential of the pn junction from the generated voltage between the source and the drain during the reflux operation and to be lower than the breakdown voltage of the gate insulating film 50 formed on the upper surface of the well region 33 (more desirably, to be not higher than half of the breakdown voltage of the gate insulating film 50), it is possible to suppress the breakdown of the gate insulating film 50 during the switching operation while suppressing the energization of the pn diode during the reflux operation in the well region 33.

<Method of Manufacturing Semiconductor Device>

Subsequently, a method of manufacturing the MOSFET incorporating the SBD which is the semiconductor device in accordance with the present preferred embodiment will be described.

First, on the upper surface of the semiconductor substrate 10 made of n-type silicon carbide of low resistance, which has 4H polytype, in which the first main surface is a (0001) plane in plane orientation, the drift layer 20 made of silicon carbide, having an n-type impurity concentration of not lower than $1 \times 10^{15}$ cm$^{-3}$ and not higher than $1 \times 10^{17}$ cm$^{-3}$ and a thickness of not smaller than 5 μm and not larger than 50 μm, is epitaxially grown by the chemical vapor deposition (CVD) method.

Next, on the upper surface of the drift layer 20, an implantation mask is formed of a photoresist or the like, and Al which is a p-type impurity is ion-implanted. At that time, the depth of the ion implantation of Al does not exceed the thickness of the drift layer 20 and is, for example, not smaller than 0.5 μm and not larger than 3 μm. Further, the impurity concentration of Al which is ion-implanted is, for example, in a range of not lower than $1 \times 10^{17}$ cm$^{-3}$ and not higher than $1 \times 10^{19}$ cm$^{-3}$, which is higher than the first impurity concentration of the drift layer 20.

After that, the implantation mask is removed. The region into which Al is ion-implanted in this process step becomes the well region 31.

Subsequently, a region to become the well region 32 and a region to become the well region 33 are formed by the same method as used in the formation of the well region 31. This process step may be a process step performed at the same time as the process step for forming the well region 31. In that case, the number of process steps can be reduced.

The dividing region 25 is formed as a remaining portion in which the well region 32 and the well region 33 are not formed. The impurity concentration of the first conductivity type of the dividing region 25 is equivalent to the impurity concentration of the drift layer 20.

Further, by additionally performing n-type impurity implantation into the dividing region 25, the impurity concentration of the dividing region 25 may be adjusted to a desired one different from that of the drift layer 20. By increasing the n-type impurity concentration, the width of the dividing region 25 required to realize the same punch through voltage can be reduced and reduction in the chip size and improvement of the breakdown voltage are expected.

Next, on the upper surface of the drift layer 20, the implantation mask is formed of the photoresist or the like. Then, ion implantation of Al which is a p-type impurity is performed from above the implantation mask.

At that time, the depth of the ion implantation of Al does not exceed the thickness of the drift layer 20 and is, for example, not smaller than 0.5 μm and not larger than 3 μm. Further, the impurity concentration of Al which is ion-implanted is, for example, in a range of not lower than $1 \times 10^{16}$ cm$^{-3}$ and not higher than $1 \times 10^{18}$ cm$^{-3}$, which is higher than the first impurity concentration of the drift layer 20 and lower than the Al concentration of the well region 31.

After that, the implantation mask is removed. The region into which Al is ion-implanted in this process step becomes the JTE region 37.

Next, on the upper surface of the drift layer 20, the implantation mask is formed of the photoresist or the like, and N (nitrogen) which is an n-type impurity is ion-implanted. The depth of the ion implantation of N is shallower than the thickness of the well region 31. Further, the impurity concentration of N which is ion-implanted is, for example, in a range of not lower than $1 \times 10^{18}$ cm$^{-3}$ and not higher than $1 \times 10^{21}$ cm$^{-3}$ and exceeds the second impurity concentration of p type of the well region 31. Among the region into which N is implanted in this process step, a region of n type becomes the source region 40.

Next, on the upper surface of the drift layer 20, the implantation mask is formed of the photoresist or the like, and Al which is a p-type impurity is ion-implanted. Then, the implantation mask is removed. The region into which Al is implanted in this process step becomes the high concentration well injection region 35.

The high concentration well injection region 35 is a region provided to achieve an excellent electrical contact between the well region 31 and the first ohmic electrode 71, and it is desirable that the p-type impurity concentration of the high concentration well injection region 35 should be set higher than the second impurity concentration of p type of the well region 31.

When the p-type impurity is ion-implanted in this process step, for the purpose of reducing the resistance of the high concentration well injection region 35, it is desirable that the ion implantation should be performed after heating the semiconductor substrate 10 or the drift layer 20 to 150° C. or higher.

Subsequently, by repeating the same process step as the formation of the high concentration well injection region 35, the high concentration well injection region 36 is formed.

Herein, by forming the high concentration well injection region 35 and the high concentration well injection region 36 at the same time, the number of process steps for the formation may be reduced. By reducing the number of process steps for the formation, the process cost can become lower and the chip cost can be reduced.

Next, in an inert gas atmosphere of argon (Ar) gas or the like, annealing is performed by using a heat treatment apparatus, for example, at a temperature not lower than 1300° C. and not higher than 1900° C. for not shorter than 30 seconds and not longer than one hour. By this annealing, ion-implanted N and Al are electrically activated.

Subsequently, by using the CVD method, the photolithography technique, or the like, the field insulating film 52 made of a silicon oxide film, having a film thickness of, for example, not smaller than 0.5 μm and not larger than 2 μm, is formed in a region other than the position almost corresponding to the above-described active region.

At that time, for example, after forming the field insulating film 52 on the entire surface, the field insulating film 52 at the position almost corresponding to a cell region should be removed by the photolithography technique, etching, or the like.

Subsequently, the upper surface of the silicon carbide not covered with the field insulating film 52 is thermally oxidized and the silicon oxide which is the gate insulating film 50, having a desired thickness, is thereby formed.

Next, on the upper surface of the gate insulating film 50, a polycrystalline silicon film having conductivity is formed by the low-pressure CVD method. Then, by patterning the polycrystalline silicon film, the gate electrode 60 is formed.

Subsequently, the interlayer insulating film 55 is formed by the low-pressure CVD method. Then, a contact hole which penetrates the interlayer insulating film 55 and the gate insulating film 50 and reaches the high concentration well injection region 35 and the source region 40 in the unit cell is formed and the well contact hole 91 is formed at the same time.

Next, after forming a metal film made mainly of nickel (Ni) by the sputtering method or the like, a heat treatment is performed, for example, at a temperature not lower than 600° C. and not higher than 1100° C. Then, by reacting the metal film made mainly of Ni with a silicon carbide layer inside the contact hole, silicide is formed between the silicon carbide layer and the metal film.

Subsequently, the metal film remaining on the interlayer insulating film 55, other than the silicide formed by the above-described reaction, is removed by wet etching. The first ohmic electrode 71 is thereby formed.

Subsequently, by forming a metal made mainly of Ni on the back surface (second main surface) of the semiconductor substrate 10 and further performing a heat treatment, the back ohmic electrode 73 is formed on the back side of the semiconductor substrate 10.

Next, by patterning using the photoresist or the like, the interlayer insulating film 55 on the upper surface of the separation region 22, the interlayer insulating film 55 formed at the position to become the gate insulating film 50, and the interlayer insulating film 55 formed at the position to become the gate contact hole 95 are removed. As a removing method, it is preferable to use wet etching which produces no damage on the upper surface of the silicon carbide which is to become an SBD interface.

Subsequently, by the sputtering method or the like, the first Schottky electrode 75 is deposited. As the first Schottky electrode 75, it is preferable to deposit, for example, titanium (Ti), molybdenum (Mo), Ni, or the like.

After that, on the upper surface of the semiconductor substrate 10 having been subjected to these treatments, by the sputtering method or the vapor deposition method, a wiring metal of Al or the like is formed. Then, by processing the wiring metal into a predetermined shape with the photolithography technique, the source electrode 80 in contact with the first ohmic electrode 71 and the first Schottky electrode 75, and the gate wire 82 in contact with the gate electrode 60 are formed.

Further, on the lower surface of the back ohmic electrode 73 formed on the back surface of the semiconductor substrate 10, the drain electrode 85 which is a metal film is formed.

The Second Preferred Embodiment

A semiconductor device in accordance with the present preferred embodiment will be described. In the following description, constituent elements identical to those described in the above-described preferred embodiment are represented by the same reference signs and detailed description thereof will be omitted as appropriate.

<Structure of Semiconductor Device>

Figure 3:
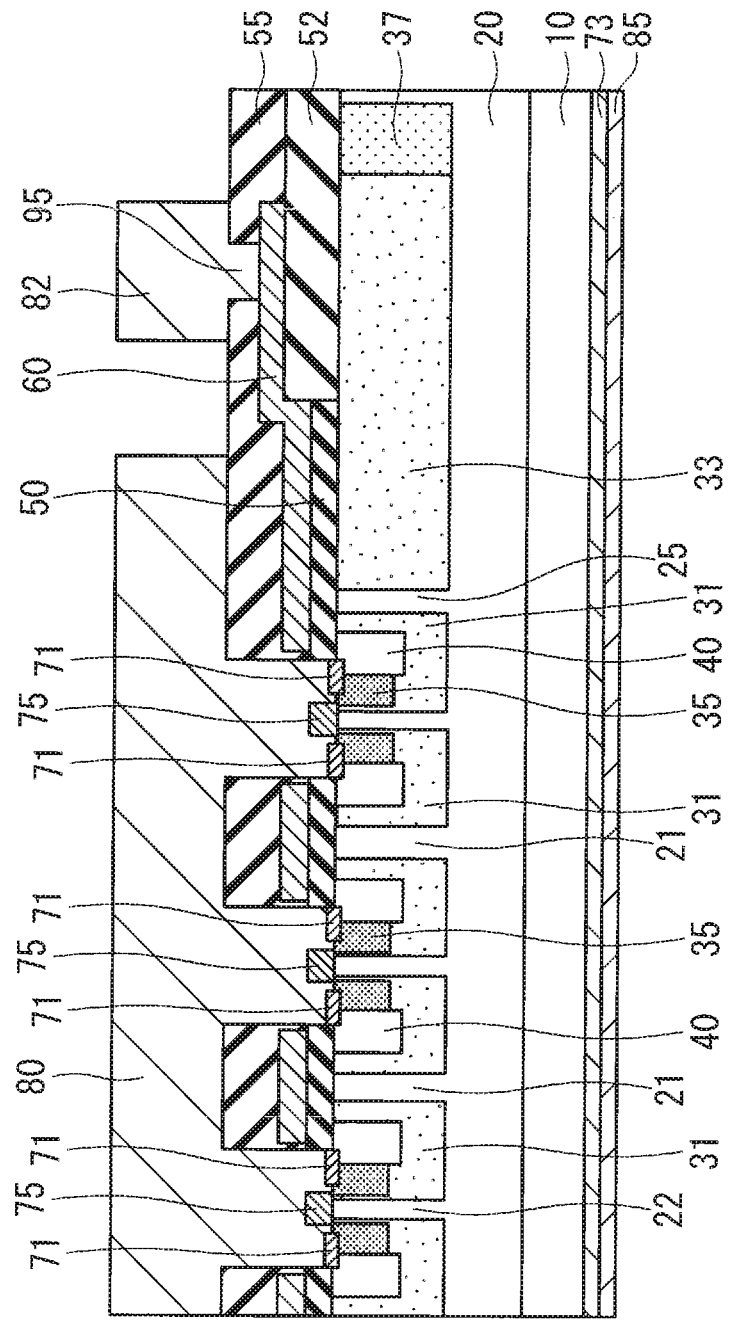
FIG. 3 is a cross section schematically illustrating a structure for realizing the semiconductor device in accordance with the preferred embodiment.

FIG. 3 is a cross section schematically illustrating a structure for realizing a semiconductor device in accordance with the present preferred embodiment.

Though the active region having the well region 31 is clearly distinguished from the well region 32 in the first preferred embodiment, there may be a case where no well region 32 is present and the dividing region 25 is formed between the well region 31 on the outermost side (terminal region side) among the well regions 31 and the well region 33, as exemplarily illustrated in FIG. 3.

In this case, the dividing region 25 formed between the well region 31 and the well region 33 performs the same function as that of the dividing region 25 formed between the well region 31 and the well region 32. Specifically, in the state where no well region 32 is present, the description in the first preferred embodiment can be understood by interpreting the well region 31 on the outermost side as the second well.

The Third Preferred Embodiment

A semiconductor device in accordance with the present preferred embodiment will be described. In the following description, constituent elements identical to those described in the above-described preferred embodiments are represented by the same reference signs and detailed description thereof will be omitted as appropriate.

<Structure of Semiconductor Device>

Figure 4:
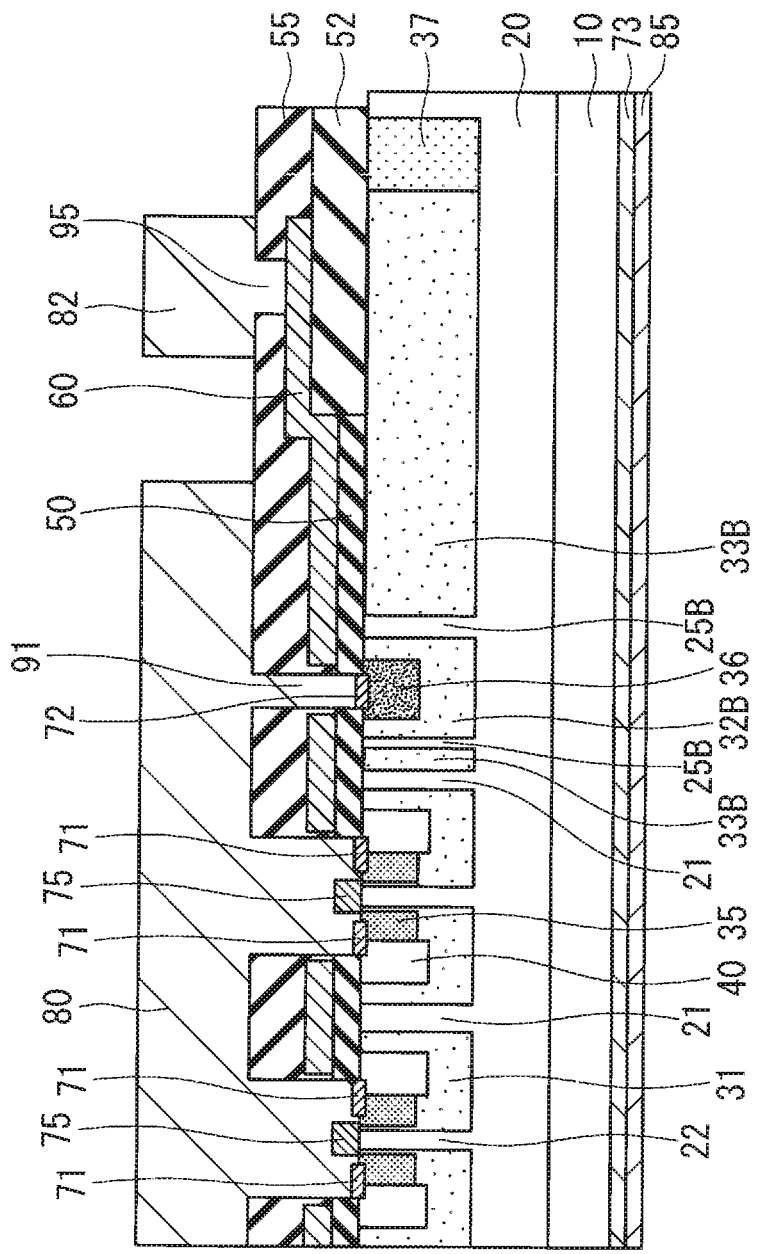
FIG. 4 is a cross section schematically illustrating a structure for realizing the semiconductor device in accordance with the preferred embodiment.
Figure 5:
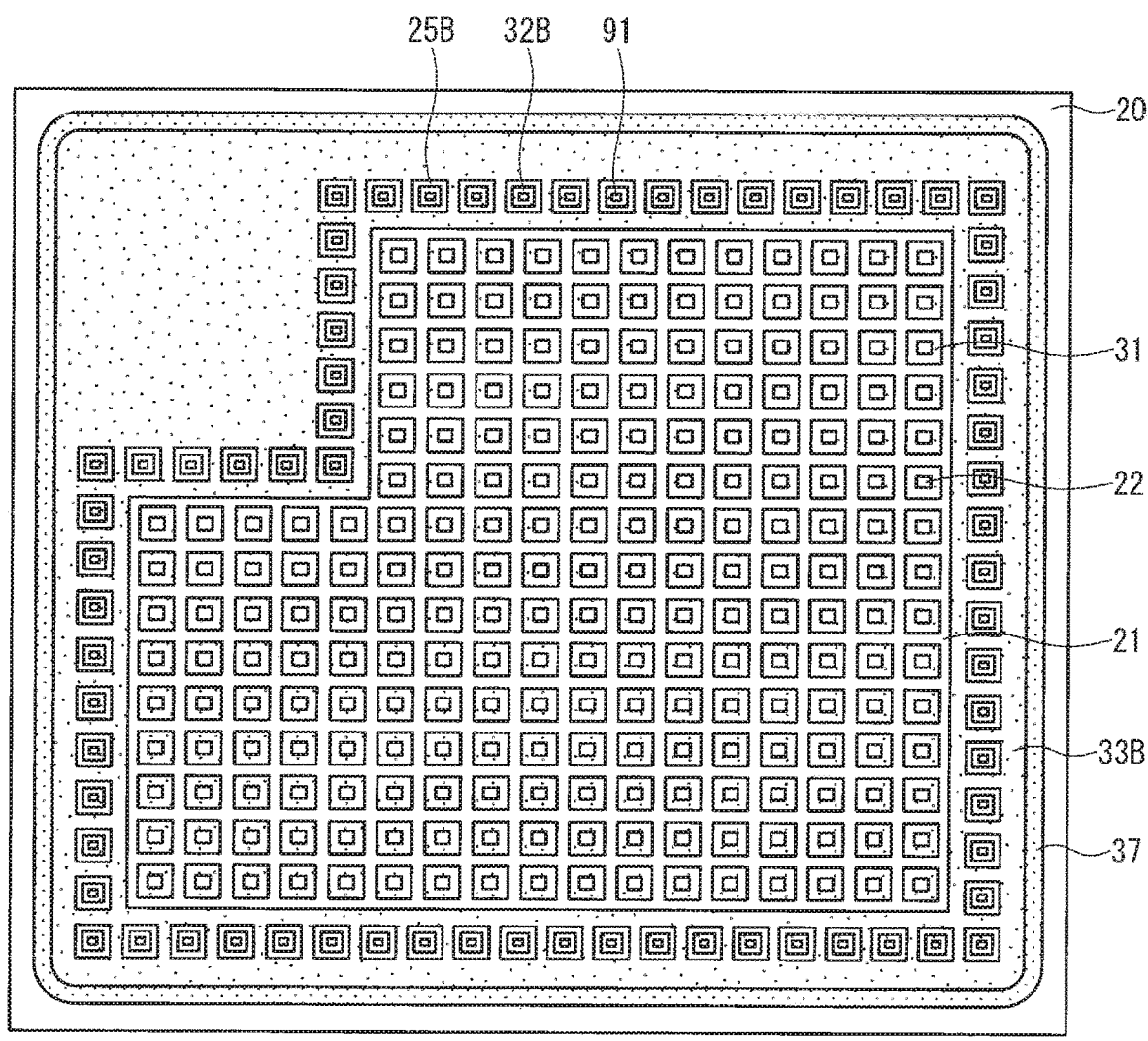
FIG. 5 is a plan view schematically illustrating a structure for realizing the semiconductor device in accordance with the preferred embodiment.

FIG. 4 is a cross section schematically illustrating a structure for realizing a semiconductor device in accordance with the present preferred embodiment. FIG. 5 is a plan view schematically illustrating a structure for realizing the semiconductor device in accordance with the present preferred embodiment.

In the semiconductor device of the present preferred embodiment, as exemplarily illustrated in FIGS. 4 and 5, a dividing region 25B around a well region 32B is so formed as to surround the well region 32B, the second ohmic electrode 72, and the well contact hole 91 in a plan view.

With such a structure, since the area of the well region 32B in which energization of the pn diode may occur can be reduced, it is possible to obtain the semiconductor device with high reliability.

A method of manufacturing the semiconductor device of the present preferred embodiment is almost the same as that in the case exemplarily illustrated in the first preferred embodiment, and it is only necessary to simply change a mask pattern for forming the well region 32B and a well region 33B.

The Fourth Preferred Embodiment

A semiconductor device in accordance with the present preferred embodiment will be described. In the following description, constituent elements identical to those described in the above-described preferred embodiments are represented by the same reference signs and detailed description thereof will be omitted as appropriate.

<Structure of Semiconductor Device>

Figure 6:
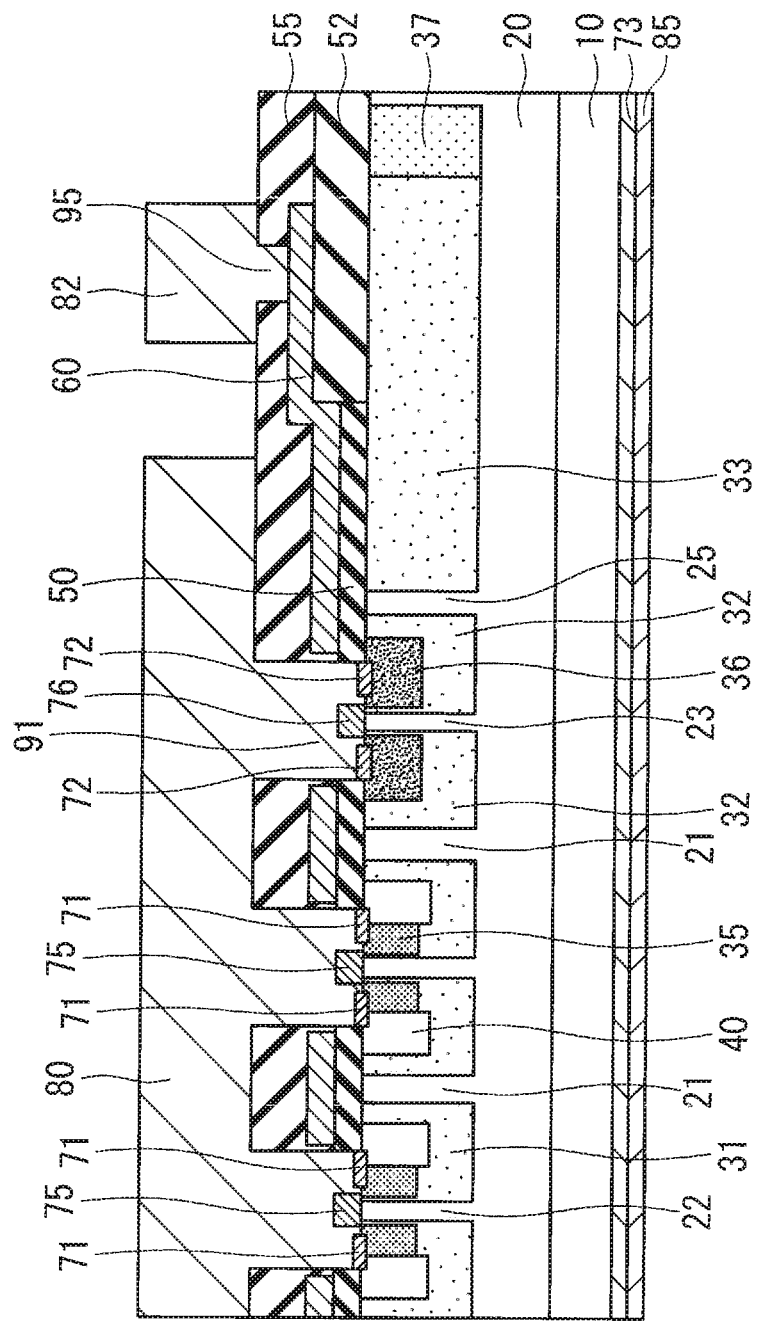
FIG. 6 is a cross section schematically illustrating a structure for realizing the semiconductor device in accordance with the preferred embodiment.

FIG. 6 is a cross section schematically illustrating a structure for realizing a semiconductor device in accordance with the present preferred embodiment.

In the semiconductor device of the present preferred embodiment, as exemplarily illustrated in FIG. 6, an SBD region is formed inside the region in which the well contact hole 91 is formed.

Specifically, an n-type separation region 23 obtained by partially chipping a well region 32C is formed. The separation region 23 is formed, penetrating from a surface layer of the well region 32C in the depth direction. Then, on an upper surface of the separation region 23, a second Schottky electrode 76 is formed.

Further, in a plane portion in which the separation region 23 is formed, the second ohmic electrode 72 and a high concentration well injection region 36C are also chipped.

With such a structure, the SBD current can be carried also below the well region 32C. As a result, a voltage drop occurs in the drift layer 20 below the well region 32C or the semiconductor substrate 10, and the forward voltage to be applied to the pn junction formed between the well region 32C and the drift layer 20 is reduced by the dropped voltage. As a result, the energization of the pn diode in the well region 32C is suppressed and it is possible to obtain the semiconductor device with higher reliability.

A method of manufacturing the semiconductor device of the present preferred embodiment is almost the same as that in the case exemplarily illustrated in the first preferred embodiment, and it is only necessary to simply change a mask pattern for forming the well region 32C, the well region 33, and the high concentration well injection region 36C and then form the second Schottky electrode 76 by the same method as that of forming the first Schottky electrode 75.

The Fifth Preferred Embodiment

A semiconductor device in accordance with the present preferred embodiment will be described. In the following description, constituent elements identical to those described in the above-described preferred embodiments are represented by the same reference signs and detailed description thereof will be omitted as appropriate.

<Structure of Semiconductor Device>

Figure 7:
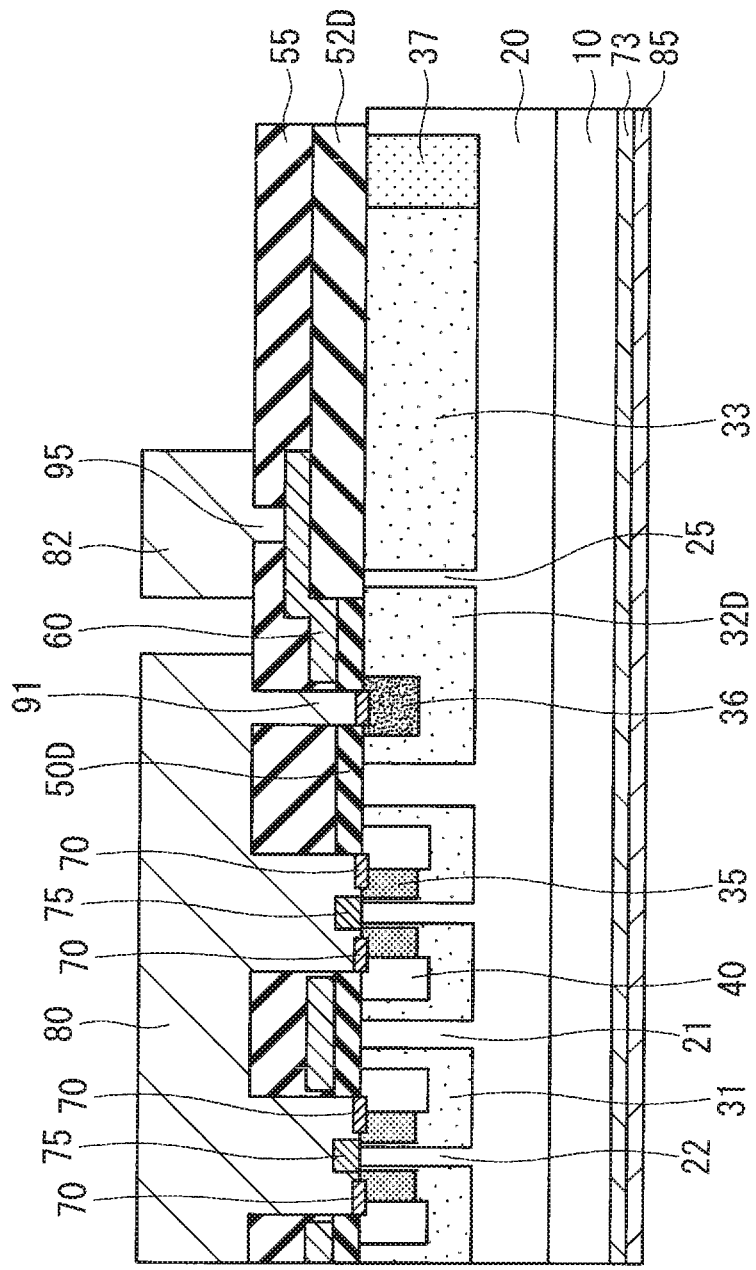
FIG. 7 is a cross section schematically illustrating a structure for realizing the semiconductor device in accordance with the preferred embodiment.

FIG. 7 is a cross section schematically illustrating a structure for realizing a semiconductor device in accordance with the present preferred embodiment.

In the semiconductor device of the present preferred embodiment, as exemplarily illustrated in FIG. 7, a field insulating film 52D is formed in the entire region in which the well region 33 and the gate electrode 60 overlap each other in a plan view. Particularly in FIG. 7, the field insulating film 52D is so formed as to cover the entire upper surface of the well region 33.

Specifically, no gate insulating film 50D is formed in the entire region in which the well region 33 and the gate electrode 60 overlap each other in a plan view. In other words, it can be expressed that a boundary between the gate insulating film 50D and the field insulating film 52D is positioned on an upper surface of a well region 32D.

With such a structure, it is possible to suppress the breakdown due to the displacement current during the switching operation.

In the structure exemplarily illustrated in the first preferred embodiment, for example, when a voltage higher than the dielectric breakdown voltage of the gate insulating film 50 occurs in the well region 33, the gate insulating film 50 is broken and an element failure thereby occurs.

On the other hand, in the structure exemplarily illustrated in the present preferred embodiment, no gate insulating film is formed on the upper surface of the well region 33, and the field insulating film 52D having an overwhelmingly high dielectric breakdown voltage is formed instead.

For this reason, a voltage fluctuation in the well region 32D leading to the element destruction significantly increases. From another point of view, since the punch through voltage of the dividing region 25 can be designed to be more higher, it is possible to further suppress the forward energization of the pn diode.

The Sixth Preferred Embodiment

A semiconductor device in accordance with the present preferred embodiment will be described. In the following description, constituent elements identical to those described in the above-described preferred embodiments are represented by the same reference signs and detailed description thereof will be omitted as appropriate.

<Structure of Semiconductor Device>

Figure 8:
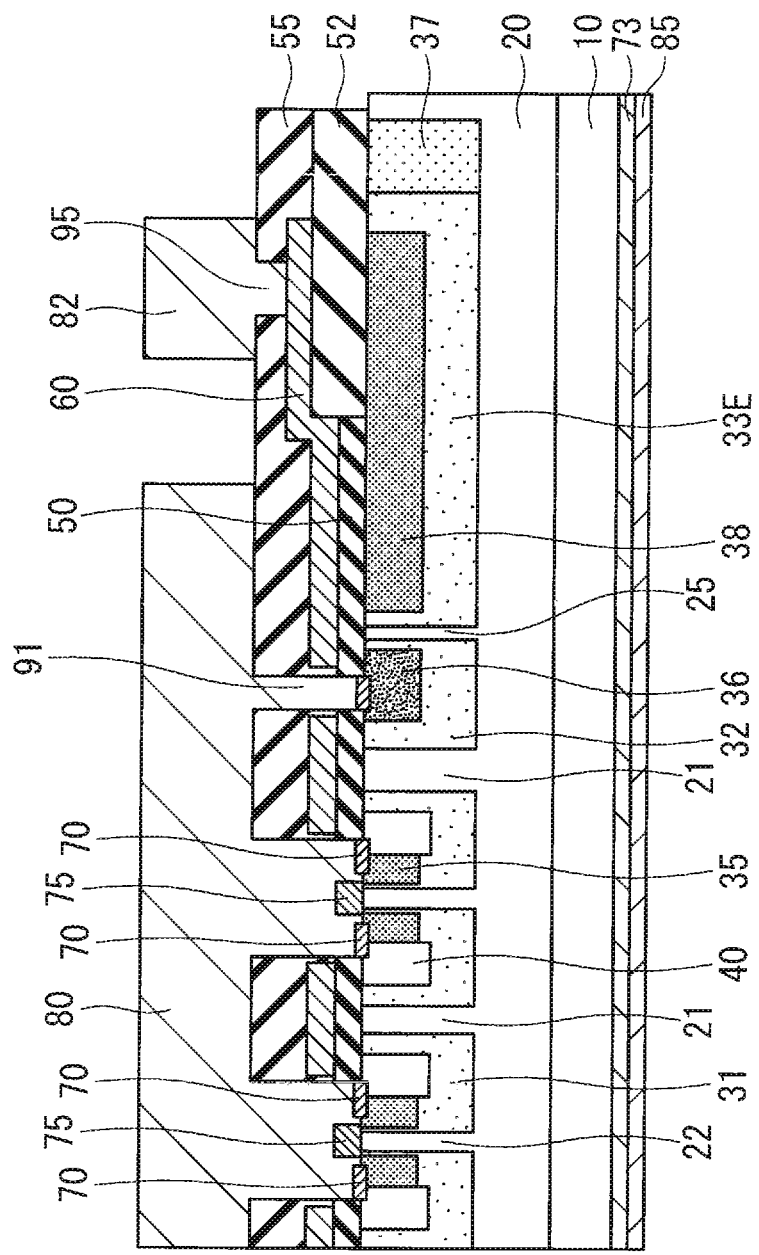
FIG. 8 is a cross section schematically illustrating a structure for realizing the semiconductor device in accordance with the preferred embodiment.

FIG. 8 is a cross section schematically illustrating a structure for realizing a semiconductor device in accordance with the present preferred embodiment.

In the semiconductor device of the present preferred embodiment, as exemplarily illustrated in FIG. 8, a p-type high concentration well injection region 38 is formed over a relatively wide range in a surface layer of a well region 33E. The impurity concentration of the high concentration well injection region 38 is higher than that of the well region 31.

With such a structure, it is possible to reduce the resistance of the well region 33E in the chip plane direction, i.e., the sheet resistance.

Therefore, even a portion in the well region 33E far away from the well contact hole 91, it is possible to reduce the voltage fluctuation in the well region 33E during the switching operation. Therefore, it is possible to obtain the semiconductor device with high reliability, which is hard to break during a high-speed switching operation.

On the other hand, in a reflux state, since the sheet resistance of the well region 33E is reduced, the forward voltage applied to the pn junction at the portion in the well region 33E far away from the well contact hole 91 disadvantageously increases. By designing the punch through voltage of the dividing region 25 to be sufficiently high, however, the problem in which the forward current is carried in the pn junction formed of the well region 33E and the drift layer 20 does not arise.

In a method of manufacturing the semiconductor device of the present preferred embodiment, an implantation step in which the high concentration well injection region 38 is formed has only to be added to the method exemplarily illustrated in the first preferred embodiment. Alternatively, when the implantation for the high concentration well injection region 38 is performed at the same time as the implantation for the high concentration well injection region 35 or the implantation for the high concentration well injection region 36, it is possible to obtain the structure of the semiconductor device in accordance with the present preferred embodiment without increasing the number of process steps.

The Seventh Preferred Embodiment

A semiconductor device in accordance with the present preferred embodiment will be described. In the following description, constituent elements identical to those described in the above-described preferred embodiments are represented by the same reference signs and detailed description thereof will be omitted as appropriate.

<Structure of Semiconductor Device>

Figure 9:
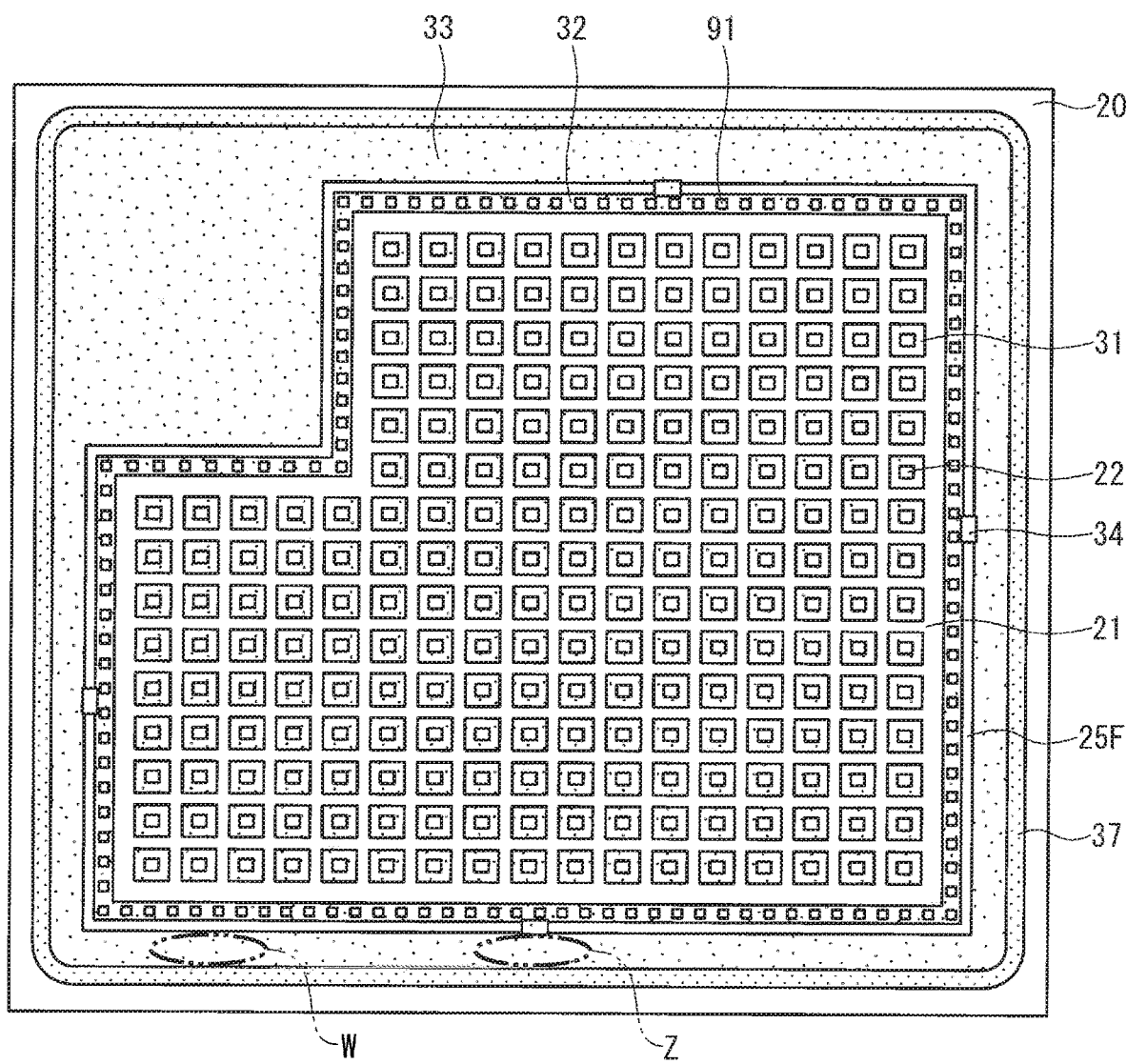
FIG. 9 is a plan view schematically illustrating a structure for realizing the semiconductor device in accordance with the preferred embodiment.

FIG. 9 is a plan view schematically illustrating a structure for realizing a semiconductor device in accordance with the present preferred embodiment.

In the semiconductor device of the present preferred embodiment, as exemplarily illustrated in FIG. 9, a p-type auxiliary conductive region 34 is formed in, for example, part of a surface layer of a dividing region 25F. In FIG. 9, a plurality of auxiliary conductive regions 34 are formed. With each of the auxiliary conductive regions 34, the well region 32 and the well region 33 are electrically connected to each other.

With such a structure, the potential of the well region 33 is not brought into a floating state, and it is possible to suppress problems such as a change in the withstand voltage characteristics due to charge-up, or the like.

At that time, since currents flowing in the auxiliary conductive region 34 are carried, not through the dividing region 25F, in the vicinity of the auxiliary conductive region 34 in the well region 33, like the region Z shown in FIG. 9, breakdown voltage degradation may occur.

In a portion far away from the auxiliary conductive region 34 in a plan view, like the region W shown in FIG. 9, however, since two-dimensionally long conduction in the well region 33 is needed, a large voltage drop is caused by the sheet resistance of the well region 33. For this reason, bipolar energization is suppressed.

When the ratio of the auxiliary conductive region 34 to the dividing region 25F increases, the above-described effect of suppressing the bipolar energization decreases, and in the well region 33, a region in which the forward current of the pn junction is carried increases. Therefore, it is desirable that the total length in which the auxiliary conductive region 34 is formed in the chip should be shorter than the total length in which the dividing region 25F is formed.

Herein, the term "length" in the description on the length in which the auxiliary conductive region 34 is formed and the length in which the dividing region 25F is formed refers to a length in a direction intersecting the direction connecting the well region 32 and the well region 33.

It is thereby possible to reduce the possibility of causing the breakdown voltage degradation to about half, as compared with a case where the structure of the semiconductor device in accordance with the present preferred embodiment is not used. More preferably, by designing the total length in which the auxiliary conductive region 34 is formed to be not larger than one tenth of the total length in which the dividing region 25F is formed, the possibility of causing the breakdown voltage degradation is reduced to not larger than about one tenth and it is possible to significantly increase the reliability of the element.

A method of manufacturing the semiconductor device of the present preferred embodiment is almost the same as that in the case exemplarily illustrated in the first preferred embodiment, and an implantation step in which the auxiliary conductive region 34 is formed has only to be added. Alternatively, it is only necessary to change a mask pattern so that the implantation for any one of the JTE region 37, the well region 31, the well region 32, and the well region 33 and the implantation for the auxiliary conductive region 34 may be performed at the same time.

Effects Produced by the Above-Described Preferred Embodiments

Hereinafter, the effects of the above-described preferred embodiments will be described. In the following description, though the effects based on the specific structures exemplarily illustrated in the above-described preferred embodiments will be described, the structure may be replaced by any other specific structure exemplarily illustrated in the specification of the present application within the scope where the same effects can be produced.

Further, this replacement may be made across a plurality of preferred embodiments. In other words, the respective structures exemplarily illustrated in the different preferred embodiments may be combined to produce the same effects.

According to the above-described preferred embodiments, the semiconductor device includes a drift layer 20 of a first conductivity type, a first well region of a second conductivity type, a first separation region of the first conductivity type, a source region 40 of the first conductivity type, a first Schottky electrode 75, a first ohmic electrode 71, a second well region of the second conductivity type, a third well region of the second conductivity type, a second ohmic electrode 72, a dividing region 25 of the first conductivity type, and a source electrode 80. Herein, the well region 31 corresponds to the first well region. Further, the separation region 22 corresponds to the first separation region. Furthermore, the well region 32 corresponds to the second well region. Further, the well region 33 corresponds to the third well region. The drift layer 20 is a wide-gap semiconductor layer provided on an upper surface of a semiconductor substrate 10 of the first conductivity type. A plurality of well regions 31 are provided, being separated from one another in a surface layer of the drift layer 20. The separation region 22 is provided penetrating from a surface layer of each of the well regions 31 in a depth direction. The source region 40 is provided in the surface layer of each of the well regions 31. The first Schottky electrode 75 is provided on an upper surface of the separation region 22. The first ohmic electrode 71 is provided at least partially in a surface layer of the source region 40. The well region 32 is so provided in the surface layer of the drift layer 20 as to sandwich the whole of the plurality of well regions 31 in a plan view and has an area larger than that of each of the well regions 31. The well region 33 is so provided in the surface layer of the drift layer 20 as to sandwich the well region 32 in a plan view and has an area larger than that of the well region 32. The second ohmic electrode 72 is provided in part of the well region 32. The dividing region 25 is provided between the well region 32 and the well region 33, having an upper surface which is in contact with an insulator. The source electrode 80 is connected to the first Schottky electrode 75, the first ohmic electrode 71, and the second ohmic electrode 72.

With such a structure, it is possible to effectively suppress the forward voltage shift due to occurrence of the stacking fault. Specifically, during the reflux operation, the dividing region 25 cuts off the current and it is thereby possible to significantly narrow the region in which the forward current is carried in the pn diode. Therefore, it is possible to significantly suppress the possibility of causing the degradation of the breakdown voltage due to extension of the stacking fault. On the other hand, during the switching operation, the current is carried in the dividing region 25, and it is thereby possible to suppress the element destruction. Therefore, it is possible to significantly increase the reliability of the semiconductor device. Further, by maintaining high-speed switching, it is possible to reduce the switching loss. Moreover, it is possible to increase the circulating current to be energized. Further, since the chip size can be reduced, it is possible to achieve low cost.

Furthermore, the other constituent elements exemplarily illustrated in the specification of the present application, other than these constituent elements, may be omitted as appropriate. In other words, only these constituent elements can produce the above-described effects.

Even in a case, however, where at least one of the other constituent elements exemplarily illustrated in the specification of the present application is added to the above-described constituent elements as appropriate, i.e., in a case where any other constituent element exemplarily illustrated in the specification of the present application, which has been not described as the above-described constituent elements, is added to the above-described constituent elements, the above-described effects can be also produced.

Further, according to the above-described preferred embodiments, the semiconductor device includes a gate electrode 60. The gate electrode 60 is provided on an upper surface of the well region 31 sandwiched between the source region 40 and the drift layer 20, with a gate insulating film 50 interposed therebetween. Furthermore, the gate electrode 60 is provided also in a region corresponding to an upper surface of the well region 33. With such a structure, it is possible to effectively suppress the forward voltage shift due to occurrence of the stacking fault.

Further, according to the above-described preferred embodiments, the well region 33 has no ohmic connection to the source electrode 80. With such a structure, the electrical conduction between the well region 33 and the source electrode 80 is performed through the dividing region 25. For this reason, since most of the voltage between the source and the drain is applied to the dividing region 25, it is possible to reduce the voltage to be applied to the pn junction. Then, by designing the voltage applied to the pn junction to be a voltage lower than 2 V which corresponds to the diffusion potential of the pn junction, it is possible to suppress the forward current from flowing in the pn diode.

Further, according to the above-described preferred embodiments, a voltage V obtained from the following Eq. 3 is not higher than 50 V, $$V = \frac{qNW^2}{(2\varepsilon)} \quad (3)$$

where the width of the dividing region 25 in a direction connecting the well region 32 and the well region 33 is W, the effective impurity concentration of the dividing region 25 is N, the dielectric constant of the semiconductor is E, and the elementary electric charge is q. With such a structure, by forming the dividing region 25 between the well region 32 and the well region 33 and designing the punch through voltage thereof to be higher than a value obtained by subtracting the diffusion potential of the pn junction from the generated voltage between the source and the drain during the reflux operation and to be lower than the breakdown voltage of the gate insulating film 50 formed on the upper surface of the well region 33, it is possible to suppress the breakdown of the gate insulating film 50 during the switching operation while suppressing the energization of the pn diode during the reflux operation in the well region 33.

Further, according to the above-described preferred embodiments, a dividing region 25B surrounds the second ohmic electrode 72 in a plan view. With such a structure, since the area of a well region 32B in which energization of the pn diode may occur can be reduced, it is possible to obtain the semiconductor device with high reliability.

Further, according to the above-described preferred embodiments, the semiconductor device includes a second separation region of the first conductivity type and a second Schottky electrode 76. Herein, the separation region 23 corresponds to the second separation region. The separation region 23 is provided penetrating from a surface layer of a well region 32C in a depth direction. The second Schottky electrode 76 is provided on an upper surface of the separation region 23. With such a structure, the SBD current can be carried also below the well region 32C. As a result, a voltage drop occurs in the drift layer 20 below the well region 32C or the semiconductor substrate 10, and the forward voltage to be applied to the pn junction formed between the well region 32C and the drift layer 20 is reduced by the dropped voltage.

Further, according to the above-described preferred embodiments, the semiconductor device includes a field insulating film 52 provided in at least part of the upper surface of the well region 33. The thickness of the field insulating film 52 is larger than that of the gate insulating film 50. The gate electrode 60 is provided on the upper surface of the well region 33, with the field insulating film 52 interposed therebetween, in a region in which the field insulating film 52 is provided. With such a structure, it is possible to suppress the breakdown due to the displacement current during the switching operation.

Further, according to the above-described preferred embodiments, the gate electrode 60 is provided on the upper surface of the well region 33, with a field insulating film 52D interposed therebetween, in the region corresponding to the upper surface of the well region 33. With such a structure, it is possible to suppress the breakdown due to the displacement current during the switching operation. In other words, a voltage fluctuation in a well region 32D leading to the element destruction significantly increases.

Further, according to the above-described preferred embodiments, the semiconductor device includes a well injection region of the second conductivity type. Herein, the high concentration well injection region 38 corresponds to the well injection region. The high concentration well injection region 38 is provided in a surface layer of a well region 33E. The impurity concentration of the high concentration well injection region 38 is higher than that of the well region 31. With such a structure, it is possible to reduce the resistance of the well region 33E in the chip plane direction, i.e., the sheet resistance. Therefore, even a portion in the well region 33E far away from the well contact hole 91, it is possible to reduce the voltage fluctuation in the well region 33E during the switching operation.

Further, according to the above-described preferred embodiments, the semiconductor device includes at least one auxiliary conductive region 34 of the second conductivity type. The auxiliary conductive region 34 is provided in a surface layer of a dividing region 25F. Further, the auxiliary conductive region 34 electrically connects the well region 32 and the well region 33. With such a structure, the potential of the well region 33 is not brought into a floating state, and it is possible to suppress problems such as a change in the withstand voltage characteristics due to charge-up, or the like.

Further, according to the above-described preferred embodiments, a total length in which the auxiliary conductive region 34 is provided is not larger than one tenth of a total length in which the dividing region 25F is provided. Herein, the length in which the auxiliary conductive region 34 is provided is a length in which the auxiliary conductive region 34 is provided in a direction intersecting a direction connecting the well region 32 and the well region 33. Further, the length in which the dividing region 25F is provided is a length in which the dividing region 25F is provided in a direction intersecting a direction connecting the well region 32 and the well region 33. With such a structure, the potential of the well region 33 is not brought into a floating state, and it is possible to suppress problems such as a change in the withstand voltage characteristics due to charge-up, or the like. Further, the possibility of causing the breakdown voltage degradation can be reduced to not larger than about one tenth, and it is possible to significantly increase the reliability of the element.

Variations of the Above-Described Preferred Embodiments

In the preferred embodiments described above, as the unipolar transistor incorporating the unipolar diode, the MOSFET incorporating the SBD has been exemplarily illustrated. The above-described techniques, however, can be also applied to any other unipolar device.

For example, the unipolar transistor may be a junction field effect transistor (JFET), instead of the MOSFET. Further, instead of incorporating the SBD as the unipolar diode, for example, a field effect transistor (FET) having channel characteristics which allow energization only in a direction from the source to the drain in a state where an off potential is applied to the gate electrode, which is disclosed in Patent Publication U.S. Pat. No. 5,159,987, may be used.

In the wide-gap semiconductor having a recombination energy higher than that of silicon, like the silicon carbide, it is thought that a crystal defect is generated in a case where the forward current is carried in the parasitic pn diode, like in silicon carbide. Though silicon carbide has been exemplarily illustrated as a semiconductor material in the above-described preferred embodiments, the present invention can be applied to any other wide-gap semiconductor.

Further, the wide-gap semiconductor generally refers to a semiconductor having a band gap of about 2 eV or higher, and well known are a group III nitride such as gallium nitride (GaN) or the like, a group II oxide such as zinc oxide (ZnO) or the like, a group II chalcogenide such as zinc selenide (ZnSe) or the like, diamond, silicon carbide, and the like.

Further, though the above-described preferred embodiments describe, for example, the material quality, material, dimension, shape, relative arrangement relation, implementation condition, or the like, of each constituent element in some cases, these are exemplary in all aspects, and the present invention is not limited to those described in the specification of the present application.

Therefore, an indefinite number of modifications and variations not exemplarily illustrated are assumed within the scope of the technique disclosed in the specification of the present application. Examples of these modifications and variations include, for example, cases where at least one constituent element is deformed, where at least one constituent element is added or omitted, and where at least one constituent element in at least one preferred embodiment is extracted and combined with a constituent element in any other preferred embodiment.

When the above-described preferred embodiments describe that "one" constituent element is included, "one or more" constituent elements may be included, as long as no contradiction arises.

Further, each constituent element in the above-described preferred embodiments is a conceptual unit, including cases where one constituent element is constituted of a plurality of structures, where one constituent element corresponds to part of a structure, and where a plurality of constituent elements are included in one structure, within the scope of the technique disclosed in the specification of the present application.

Further, each constituent element in the above-described preferred embodiments includes a structure having any other constitution or shape, as long as the same function can be performed.

The description in the specification of the present application can be referred to for all purposes as to the present technique, and is not recognized as the prior art.

When a material name or the like is described, not being particularly specified, in the above-described preferred embodiments, the material includes the same containing any other additive, such as an alloy, as long as no contradiction arises.

Further, though the planar MOSFET has been described in the above-described preferred embodiments, a case where the present invention is applied to a trench MOSFET in which a trench is formed on the upper surface of the drift layer 20 can be also assumed. In the case of the trench MOSFET, a trench is formed on the upper surface of the drift layer 20 and the gate electrode is buried on the upper surface of the drift layer 20 in the trench, i.e., a bottom surface of the trench with the gate insulating film interposed therebetween.

EXPLANATION OF REFERENCE SIGNS

10 semiconductor substrate, 20 drift layer, 21, 22, 23 separation region, 25, 25B, 25F dividing region, 31, 32, 32A, 32B, 32C, 32D, 33, 33B, 33E well region, 34 auxiliary conductive region, 35, 36, 36C, 38 high concentration well injection region, 37 JTE region, 40 source region, 50, 50D gate insulating film, 52, 52D field insulating film, 55 interlayer insulating film, 60 gate electrode, 71 first ohmic electrode, 72 second ohmic electrode, 73 back ohmic electrode, 75 first Schottky electrode, 76 second Schottky electrode, 80 source electrode, 81 gate pad, 82 gate wire, 85 drain electrode, 91 well contact hole, 95 gate contact hole, A, B junction interface, W, Z region

The invention claimed is:
1. A semiconductor device, comprising:
   a drift layer of a first conductivity type which is a wide-gap semiconductor layer provided on an upper surface of a semiconductor substrate of the first conductivity type;
   a plurality of first well regions each of a second conductivity type provided, being separated from one another in a surface layer of the drift layer;
   a first separation region of the first conductivity type provided penetrating from a surface layer of each of the first well regions in a depth direction;
   a source region of the first conductivity type provided in the surface layer of each of the first well regions;
   a first Schottky electrode provided on an upper surface of the first separation region;
   a first ohmic electrode provided at least partially in a surface layer of the source region;
   a second well region of the second conductivity type which is so provided in the surface layer of the drift layer as to sandwich the whole of the plurality of first well regions in a plan view and has an area larger than that of each of the first well regions;
   a third well region of the second conductivity type which is so provided in the surface layer of the drift layer as to sandwich the second well region in a plan view and is also provided to overlap with a gate pad or a gate wire in a plan view and has an area larger than that of the second well region;

a second ohmic electrode provided in part of the second well region;

a dividing region of the first conductivity type provided between the second well region and the third well region; and a source electrode connected to the first Schottky electrode, the first ohmic electrode, and the second ohmic electrode, wherein the third well region has no electrical connection to the source electrode.

2. The semiconductor device according to claim 1, further comprising:

a gate electrode provided on an upper surface of the first well region sandwiched between the source region and the drift layer, with a gate insulating film interposed therebetween, wherein the gate electrode is provided also in a region corresponding to an upper surface of the third well region.

3. The semiconductor device according to claim 1, wherein a voltage V obtained from the following Eq. 1 is not higher than 50 V, $$V = \frac{qNW^2}{(2\varepsilon)} \quad (1)$$

where the width of the dividing region in a direction connecting the second well region and the third well region is W, the effective impurity concentration of the dividing region is N, the dielectric constant of semiconductor is $\varepsilon$, and the elementary electric charge is q.

4. The semiconductor device according to claim 1, wherein the dividing region surrounds the second ohmic electrode in a plan view.

5. The semiconductor device according to claim 1, further comprising:

a second separation region of the first conductivity type provided penetrating from a surface layer of the second well region in a depth direction; and a second Schottky electrode provided on an upper surface of the second separation region.

6. The semiconductor device according to claim 2, further comprising:

a field insulating film provided on at least part of the upper surface of the third well region, wherein the thickness of the field insulating film is larger than that of the gate insulating film, and the gate electrode is provided on the upper surface of the third well region, with the field insulating film interposed therebetween, in a region in which the field insulating film is provided.

7. The semiconductor device according to claim 6, wherein the gate electrode is provided on the upper surface of the third well region, with the field insulating film interposed therebetween, in the region corresponding to the upper surface of the third well region.

8. The semiconductor device according to claim 1, further comprising:

a well injection region of the second conductivity type provided in a surface layer of the third well region, wherein the impurity concentration of the well injection region is higher than that of the first well region.

9. The semiconductor device according to claim 1, further comprising:

at least one auxiliary conductive region of the second conductivity type provided in a surface layer of the dividing region, wherein the auxiliary conductive region electrically connects the second well region and the third well region.

10. The semiconductor device according to claim 9, wherein a total length in which the auxiliary conductive region is provided is not larger than one tenth of a total length in which the dividing region is provided, the length in which the auxiliary conductive region is provided is a length in which the auxiliary conductive region is provided in a direction intersecting a direction connecting the second well region and the third well region, and the length in which the dividing region is provided is a length in which the dividing region is provided in a direction intersecting a direction connecting the second well region and the third well region.

11. The semiconductor device according to claim 1, wherein a punch through current flows between the second well region and the third well region through the dividing region.

12. The semiconductor device according to claim 1, wherein an upper surface of the dividing region is in contact with an insulator.

\* \* \* \* \*